(12) United States Patent
Yamazaki et al.

(10) Patent No.: US 7,122,450 B2
(45) Date of Patent: Oct. 17, 2006

(54) PROCESS FOR MANUFACTURING A SEMICONDUCTOR DEVICE

(75) Inventors: Shunpei Yamazaki, Tokyo (JP); Hisashi Ohtani, Kanagawa (JP); Toru Mitsuki, Kanagawa (JP); Hideto Ohnuma, Kanagawa (JP); Tamae Takano, Kanagawa (JP); Kenji Kasahara, Kanagawa (JP); Koji Dairiki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/098,153

(22) Filed: Mar. 15, 2002

(65) Prior Publication Data

US 2002/0197785 A1   Dec. 26, 2002

(30) Foreign Application Priority Data

Mar. 16, 2001   (JP) .............................. 2001-075376

(51) Int. Cl.
*H01L 21/20* (2006.01)
*H01L 21/36* (2006.01)

(52) U.S. Cl. .............................. 438/486; 257/E21.497

(58) Field of Classification Search ................ 438/486, 438/166
See application file for complete search history.

(56) References Cited

U.S. PATENT DOCUMENTS

| | | | |
|---|---|---|---|
| 3,535,775 A | 10/1970 | Garfinkel et al. | |
| 4,371,403 A | 2/1983 | Ikubo et al. | |
| 4,477,308 A | 10/1984 | Gibson et al. | |
| 4,534,820 A | 8/1985 | Mori et al. | |
| 4,727,044 A | 2/1988 | Yamazaki | |

(Continued)

FOREIGN PATENT DOCUMENTS

EP   0 651 431   5/1995

(Continued)

OTHER PUBLICATIONS

Lumg Shehng Lee, et al., "Argon Ion-Implantation on Polysilicon or Amorphous-Silicon for Boron Penetration Suppression in p+pMOSFET," IEEE Transactions on Electron Devices, vol. 45, No. 8, Aug. 1998, pp. 1737-1744.

(Continued)

*Primary Examiner*—W. David Coleman
(74) *Attorney, Agent, or Firm*—Eric J. Robinson; Robinson Intellectual Property Law Office, P.C.

(57) ABSTRACT

A first amorphous semiconductor film is formed on an insulating surface. A catalyst element for promoting crystallization is added thereto. Thereafter, by a first heat treatment in an inert gas, a first crystalline semiconductor film is formed. A barrier layer and a second semiconductor layer are formed on the first crystalline semiconductor film. The second semiconductor layer contains a rare gas element at a concentration of $1\times10^{19}$ to $2\times10^{22}/cm^3$, preferably $1\times10^{20}$ to $1\times10^{21}/cm^3$ and oxygen at a concentration of $5\times10^{17}$ to $1\times10^{21}/cm^3$. Subsequently, by a second treatment in an inert gas, the catalyst element remaining in the first crystalline semiconductor film is moved to the second semiconductor film.

177 Claims, 18 Drawing Sheets

U.S. PATENT DOCUMENTS

| | | |
|---|---|---|
| 5,132,754 A | 7/1992 | Serikawa et al. |
| 5,147,826 A | 9/1992 | Liu et al. |
| 5,244,819 A | 9/1993 | Yue |
| 5,248,630 A | 9/1993 | Serikawa et al. |
| 5,275,896 A | 1/1994 | Garofalo et al. |
| 5,403,772 A | 4/1995 | Zhang et al. |
| 5,426,064 A | 6/1995 | Zhang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,550,070 A | 8/1996 | Funai et al. |
| 5,551,984 A | 9/1996 | Tanahashi |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,677,549 A | 10/1997 | Takayama et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,744,824 A | 4/1998 | Kousai et al. |
| 5,773,327 A | 6/1998 | Yamazaki et al. |
| 5,789,284 A | 8/1998 | Yamazaki et al. |
| 5,814,540 A | 9/1998 | Takemura et al. |
| 5,843,225 A | 12/1998 | Takayama et al. |
| 5,851,860 A | 12/1998 | Makita et al. |
| 5,869,363 A | 2/1999 | Yamazaki et al. |
| 5,888,858 A | 3/1999 | Yamazaki et al. |
| 5,893,730 A | 4/1999 | Yamazaki et al. |
| 5,897,347 A | 4/1999 | Yamazaki et al. |
| 5,915,174 A | 6/1999 | Yamazaki et al. |
| 5,923,962 A | 7/1999 | Ohtani et al. |
| 5,932,893 A | 8/1999 | Miyanaga et al. |
| 5,949,115 A | 9/1999 | Yamazaki et al. |
| 5,956,579 A | 9/1999 | Yamazaki et al. |
| 5,960,252 A | 9/1999 | Matsuki et al. |
| 5,961,743 A | 10/1999 | Yamazaki et al. |
| 5,970,327 A | 10/1999 | Makita et al. |
| 5,977,559 A | 11/1999 | Zhang et al. |
| 5,985,740 A | 11/1999 | Yamazaki et al. |
| 5,997,286 A | 12/1999 | Hemsath et al. |
| 5,998,838 A | 12/1999 | Tanabe et al. |
| 6,013,544 A | 1/2000 | Makita et al. |
| 6,015,593 A | 1/2000 | Yonkoski et al. |
| 6,022,458 A | 2/2000 | Ichikawa |
| 6,027,987 A | 2/2000 | Yamazaki et al. |
| 6,048,758 A | 4/2000 | Yamazaki et al. |
| 6,063,654 A | 5/2000 | Ohtani |
| 6,066,518 A | 5/2000 | Yamazaki |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A | 6/2000 | Yamazaki et al. |
| 6,077,758 A | 6/2000 | Zhang et al. |
| 6,083,324 A | 7/2000 | Henley et al. |
| 6,084,247 A | 7/2000 | Yamazaki et al. |
| 6,087,679 A | 7/2000 | Yamazaki et al. |
| 6,093,934 A | 7/2000 | Yamazaki et al. |
| 6,100,562 A | 8/2000 | Yamazaki et al. |
| 6,111,557 A | 8/2000 | Koyama et al. |
| 6,121,660 A | 9/2000 | Yamazaki et al. |
| 6,133,073 A | 10/2000 | Yamazaki et al. |
| 6,133,075 A | 10/2000 | Yamazaki et al. |
| 6,133,119 A | 10/2000 | Yamazaki |
| 6,153,445 A | 11/2000 | Yamazaki et al. |
| 6,156,590 A | 12/2000 | Yamazaki |
| 6,156,628 A | 12/2000 | Ohnuma et al. |
| 6,160,268 A | 12/2000 | Yamazaki |
| 6,162,667 A | 12/2000 | Funai et al. |
| 6,162,704 A | 12/2000 | Yamazaki et al. |
| 6,165,824 A | 12/2000 | Takano et al. |
| 6,168,980 B1 | 1/2001 | Yamazaki et al. |
| 6,168,981 B1 | 1/2001 | Battaglia et al. |
| 6,180,439 B1 | 1/2001 | Yamazaki et al. |
| 6,184,559 B1 | 2/2001 | Hayakawa et al. |
| 6,194,255 B1 | 2/2001 | Hiroki et al. |
| 6,197,624 B1 | 3/2001 | Yamazaki |
| 6,201,585 B1 | 3/2001 | Takano et al. |
| 6,204,101 B1 | 3/2001 | Yamazaki et al. |
| 6,204,154 B1 | 3/2001 | Zhang et al. |
| 6,207,969 B1 | 3/2001 | Yamazaki |
| 6,218,219 B1 | 4/2001 | Yamazaki et al. |
| 6,225,152 B1 | 5/2001 | Yamazaki et al. |
| 6,232,205 B1 | 5/2001 | Ohtani et al. |
| 6,232,621 B1 | 5/2001 | Yamazaki et al. |
| 6,242,290 B1 | 6/2001 | Nakajima et al. |
| 6,251,712 B1 | 6/2001 | Tanaka et al. |
| 6,255,195 B1 | 7/2001 | Linn et al. |
| 6,285,042 B1 | 9/2001 | Ohtani et al. |
| 6,287,900 B1 | 9/2001 | Yamazaki et al. |
| 6,287,988 B1 | 9/2001 | Nagamine et al. |
| 6,291,275 B1 | 9/2001 | Yamazaki et al. |
| 6,294,441 B1 | 9/2001 | Yamazaki |
| 6,300,659 B1 | 10/2001 | Zhang et al. |
| 6,303,415 B1 | 10/2001 | Yamazaki |
| 6,303,963 B1 | 10/2001 | Ohtani et al. |
| 6,306,694 B1 | 10/2001 | Yamazaki et al. |
| 6,307,214 B1 | 10/2001 | Ohtani et al. |
| 6,316,789 B1 | 11/2001 | Yamazaki et al. |
| 6,316,810 B1 | 11/2001 | Yamazaki et al. |
| 6,331,457 B1 | 12/2001 | Yamazaki et al. |
| 6,337,259 B1 | 1/2002 | Ueda et al. |
| 6,346,730 B1 | 2/2002 | Kitakado et al. |
| 6,362,507 B1 | 3/2002 | Ogawa et al. |
| 6,376,336 B1 | 4/2002 | Buynoski |
| 6,391,690 B1 | 5/2002 | Miyasaka et al. |
| 6,396,147 B1 | 5/2002 | Adachi et al. |
| 6,399,454 B1 | 6/2002 | Yamazaki |
| 6,399,988 B1 | 6/2002 | Yamazaki et al. |
| 6,420,758 B1 | 7/2002 | Nakajima et al. |
| 6,426,276 B1 | 7/2002 | Ohnuma et al. |
| 6,429,097 B1 | 8/2002 | Voutsas et al. |
| 6,436,745 B1 | 8/2002 | Gotou et al. |
| 6,461,943 B1 | 10/2002 | Yamazaki et al. |

| | | |
|---|---|---|
| 6,489,189 B1 | 12/2002 | Yamazaki et al. |
| 6,512,504 B1 | 1/2003 | Yamauchi et al. |
| 6,531,713 B1 | 3/2003 | Yamazaki et al. |
| 6,534,826 B1 | 3/2003 | Yamazaki et al. |
| 6,541,294 B1 | 4/2003 | Yamazaki et al. |
| 6,576,926 B1 | 6/2003 | Yamazaki et al. |
| 6,579,736 B1 | 6/2003 | Yamazaki et al. |
| 6,680,577 B1 | 1/2004 | Inukai et al. |
| 6,690,068 B1 | 2/2004 | Yamazaki et al. |
| 6,709,902 B1 | 3/2004 | Kitakado et al. |
| 6,737,304 B1 | 5/2004 | Yamazaki et al. |
| 6,743,649 B1 | 6/2004 | Yamazaki et al. |
| 6,787,807 B1 | 9/2004 | Yamazaki et al. |
| 6,808,968 B1 * | 10/2004 | Yamazaki et al. .......... 438/166 |
| 6,812,081 B1 * | 11/2004 | Yamazaki et al. .......... 438/197 |
| 2001/0034088 A1 | 10/2001 | Nakamura et al. |
| 2002/0028543 A1 | 3/2002 | Yamazaki et al. |
| 2002/0038889 A1 | 4/2002 | Yamazaki et al. |
| 2002/0086469 A1 | 7/2002 | Kim et al. |
| 2002/0098628 A1 | 7/2002 | Hamada et al. |
| 2002/0102764 A1 * | 8/2002 | Yamazaki et al. ............ 438/69 |
| 2002/0106861 A1 | 8/2002 | Yamazaki |
| 2002/0115271 A1 | 8/2002 | Yamazaki et al. |
| 2002/0125480 A1 | 9/2002 | Nakamura et al. |
| 2002/0134981 A1 | 9/2002 | Nakamura et al. |
| 2002/0142554 A1 | 10/2002 | Nakajima et al. |
| 2002/0151120 A1 * | 10/2002 | Yamazaki et al. .......... 438/166 |
| 2002/0151154 A1 | 10/2002 | Yamazaki et al. |
| 2002/0155652 A1 * | 10/2002 | Yamazaki et al. .......... 438/200 |
| 2002/0164843 A1 * | 11/2002 | Yamazaki et al. .......... 438/166 |
| 2002/0187594 A1 * | 12/2002 | Yamazaki et al. .......... 438/166 |
| 2003/0060057 A1 | 3/2003 | Raaijmakers et al. |
| 2003/0062499 A1 | 4/2003 | Yamazaki et al. |
| 2003/0122129 A1 | 7/2003 | Yamazaki et al. |
| 2003/0132900 A1 | 7/2003 | Yamauchi et al. |
| 2003/0197179 A1 | 10/2003 | Yamazaki et al. |
| 2004/0065902 A1 | 4/2004 | Yamazaki et al. |
| 2004/0108576 A1 | 6/2004 | Yamazaki et al. |

FOREIGN PATENT DOCUMENTS

| | | |
|---|---|---|
| JP | 05-109737 | 4/1993 |
| JP | 06-151414 | 5/1994 |
| JP | 07-130652 | 5/1995 |
| JP | 07-183540 | 7/1995 |
| JP | 08-078329 | 3/1996 |
| JP | 09-074207 | 3/1997 |
| JP | 09-115831 | 5/1997 |
| JP | 10-055951 | 2/1998 |
| JP | 3032801 | 2/2000 |
| JP | 2000-105081 | 4/2000 |
| JP | 3032801 | 4/2000 |
| JP | 2000-260777 | 9/2000 |
| JP | 2001-210828 | 8/2001 |
| JP | 2001-267264 | 9/2001 |

OTHER PUBLICATIONS

Masayasu Miyake, et al., "Characteristics of Buried-Channel pMOS Devices with Shallow Counter-Doped Layers Fabricated Using Channel Preamorphization," IEEE Transactions on Electron Devices, vol. 43, No. 3, Mar. 1996, pp. 444-449.

D. J. Llewellyn, et al., "Implantation and Annealing of Cu in InP for Electrical Isolation: Microstructural Characterisation," Optoelectronic and Microelectronic Materials and Devices Proceedings, IEEE 1997, pp. 313-316.

Kevin S. Jones, et al., "Boron Diffusion Upon Annealing of Laser Thermal Processed Silicon," Ion Implantation Technology 2000, IEEE 2000, pp. 111-114.

Specification, Claims, Abstract of U.S. Appl. No. 08/784,293 Filed Jan. 16, 1997.

Specification, Claims, Abstract, and Pending Claims' of U.S. Appl. No. 08/907,182 Filed Aug. 6, 1997.

* cited by examiner

FIG.1A STEP OF ADDING IMPURITY
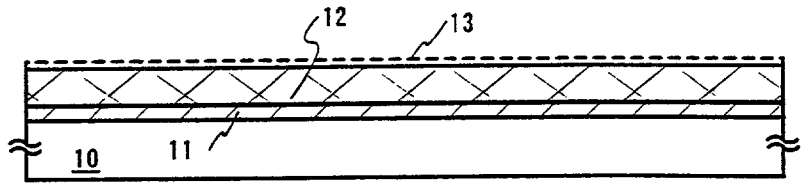
FIG.1B CRYSTALLIZATION STEP (FIRST HEAT TREATMENT)
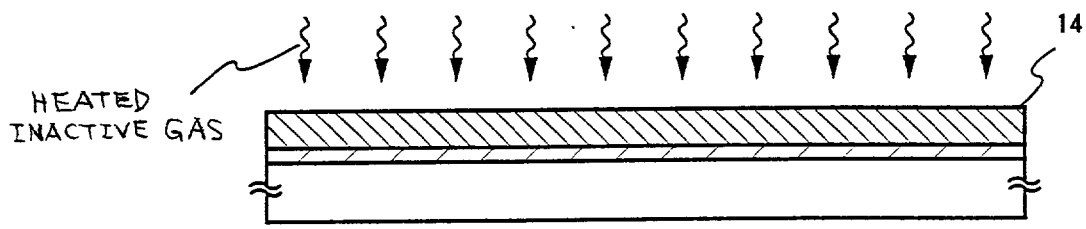
FIG.1C LASER IRRADIATION
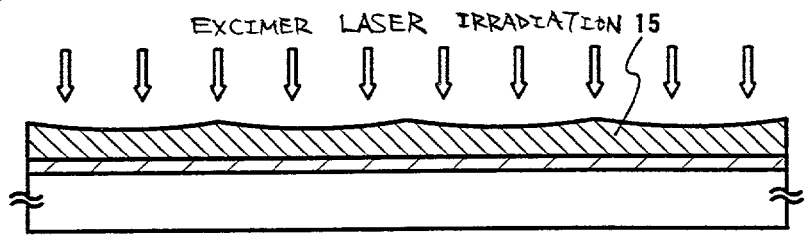
FIG.1D SECOND HEAT TREATMENT
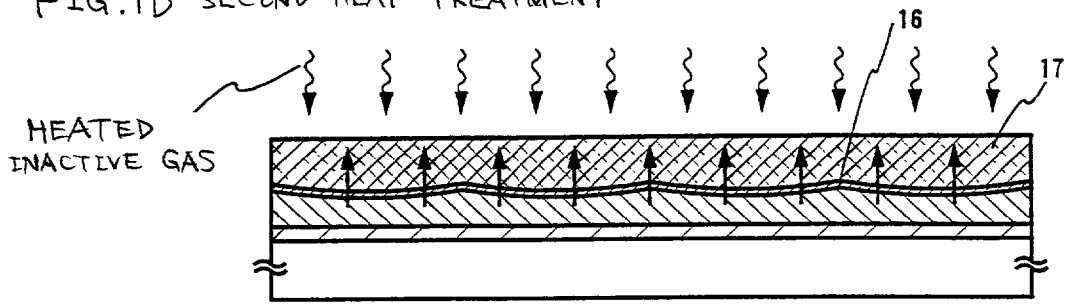
FIG.1E REMOVAL OF GETTERING SITE, BARRIER LAYER
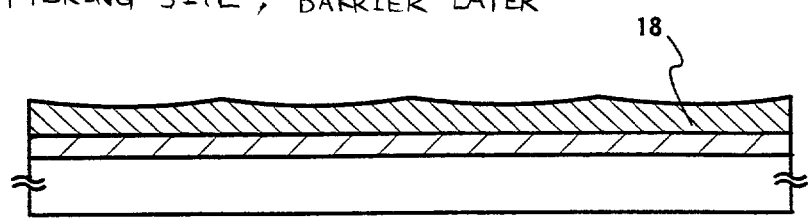

FIG. 2A STEP OF ADDING IMPURITY
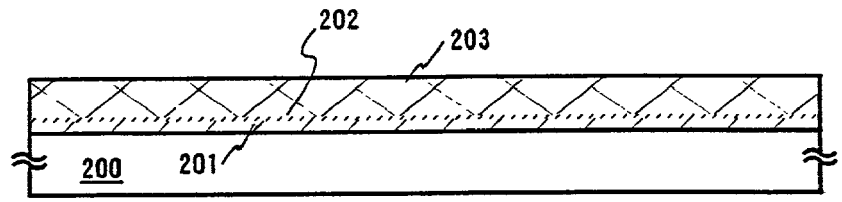
FIG. 2B HEAT TREATMENT (CRYSTALLIZATION AND GETTERING)
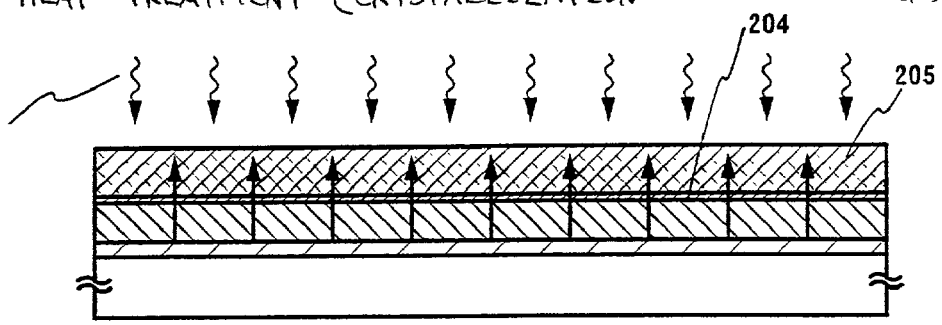
FIG. 2C REMOVAL OF GETTERING SITE, BARRIER LAYER
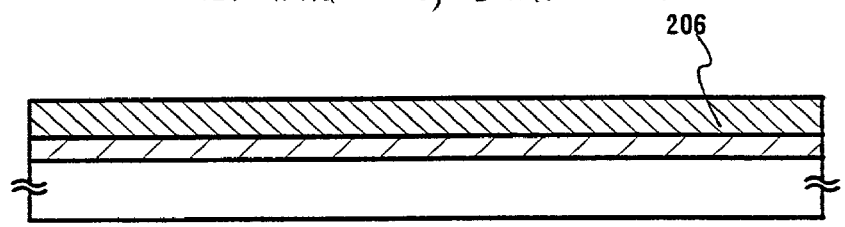
FIG. 2D LASER IRRADIATION
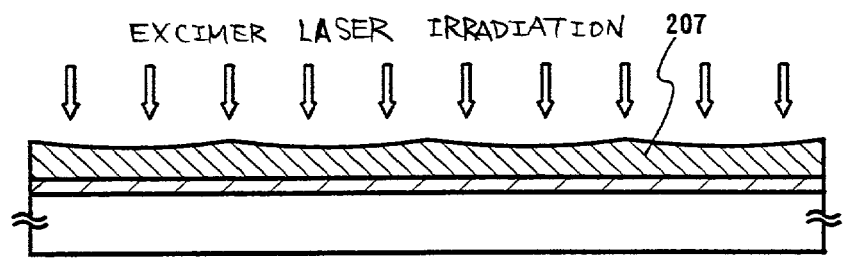

FIG.3A STEP OF FORMING BASE INSULATING FILM AND AMORPHOUS SEMICONDUCTOR FILM AND STEP OF CRYSTALLIZATION
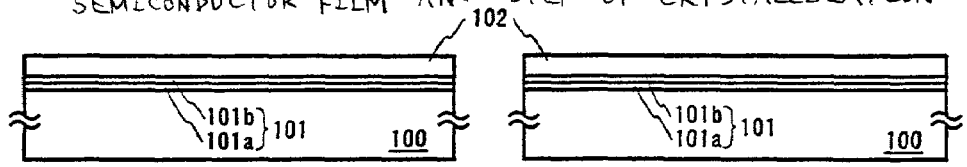
FIG.3B FORMATION OF SEMICONDUCTOR LAYER AND GATE INSULATING FILM
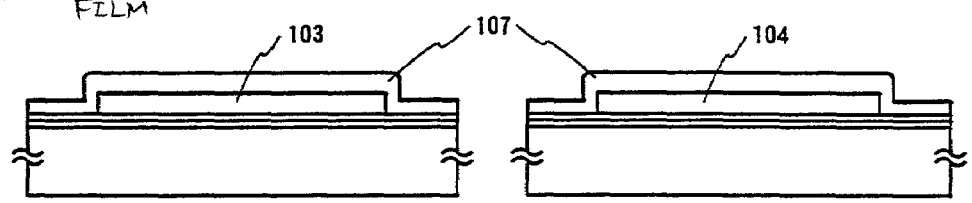
FIG.3C FORMATION OF CONDUCTIVE FILM (THREE LAYERS)
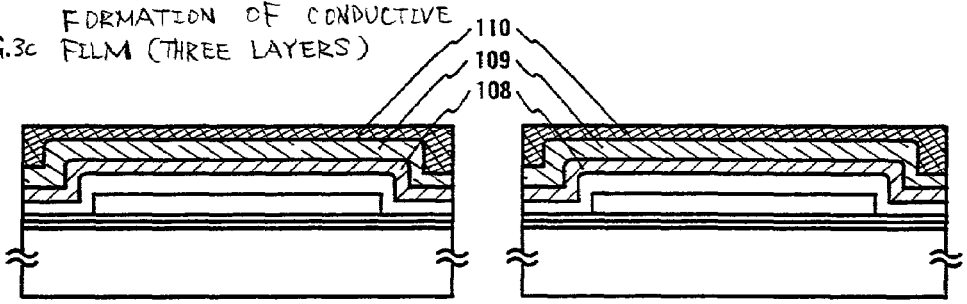
FIG.3D FIRST ETCHING STEP
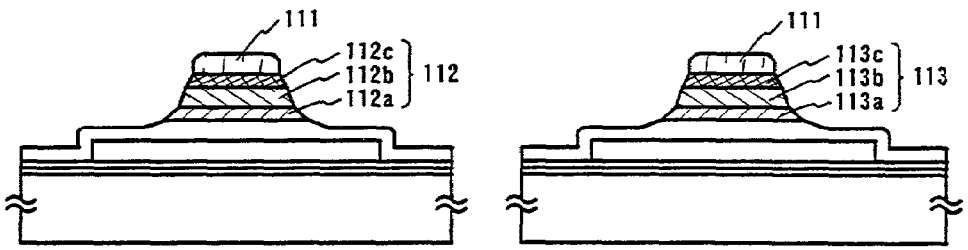
FIG.3E SECOND ETCHING STEP / FIRST DOPING STEP
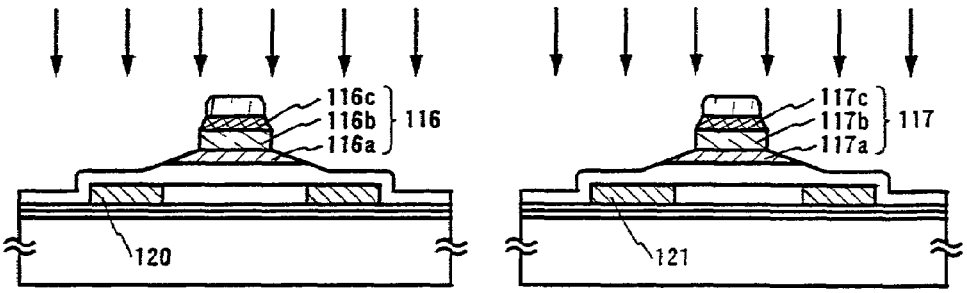

FIG.4A FORMATION OF BASE INSULATING FILM AND AMORPHOUS SEMICONDUCTOR FILM AND STEP OF CRYSTALLIZATION
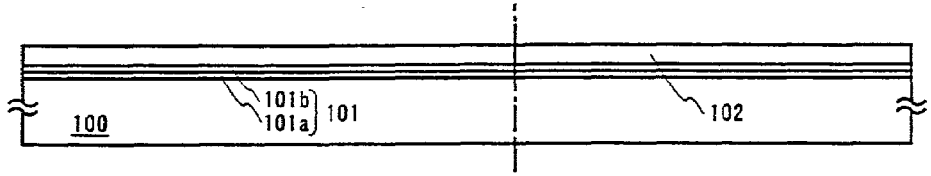
FIG.4B FORMATION OF SEMICONDUCTOR LAYER / FORMATION OF GATE INSULATING FILM
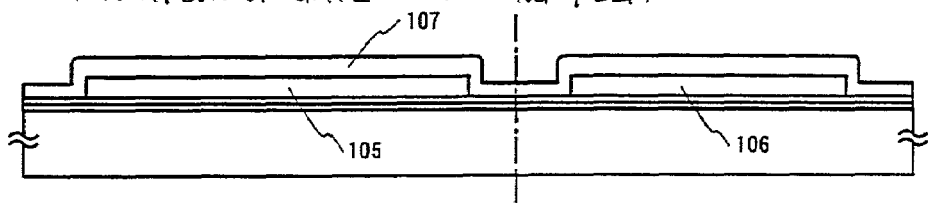
FIG.4C FORMATION OF CONDUCTIVE LAYER (THREE LAYERS)
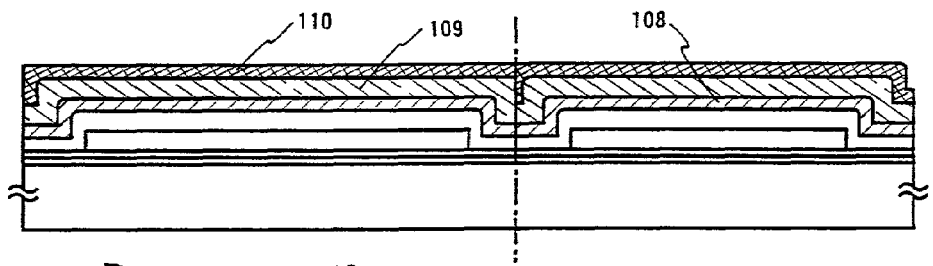
FIG.4(D) FIRST ETCHING STEP
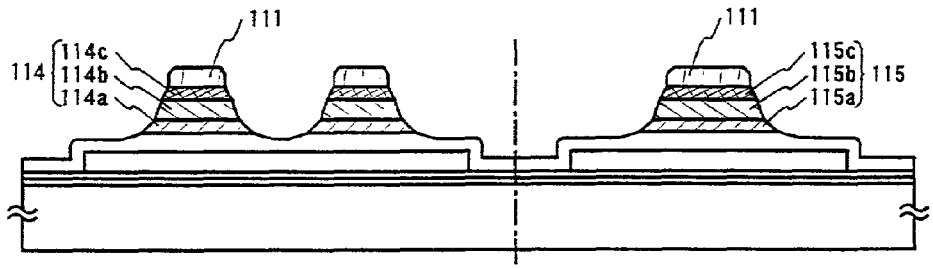
FIG.4E SECOND ETCHING STEP / FIRST DOPING STEP
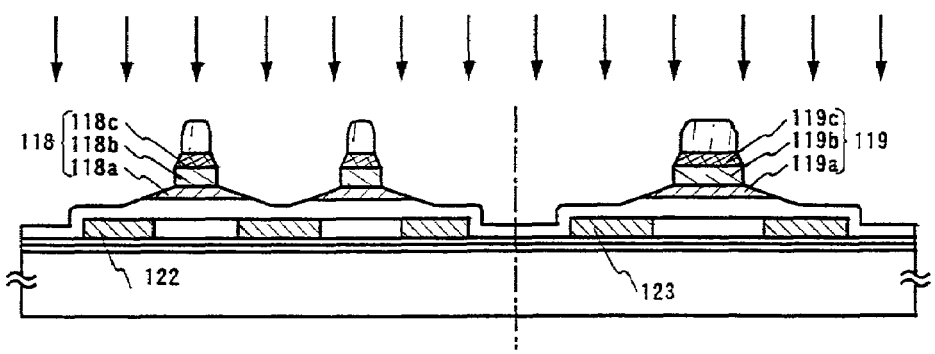

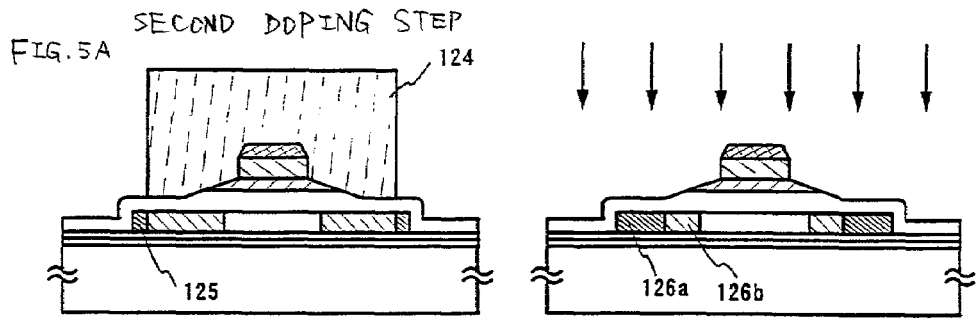
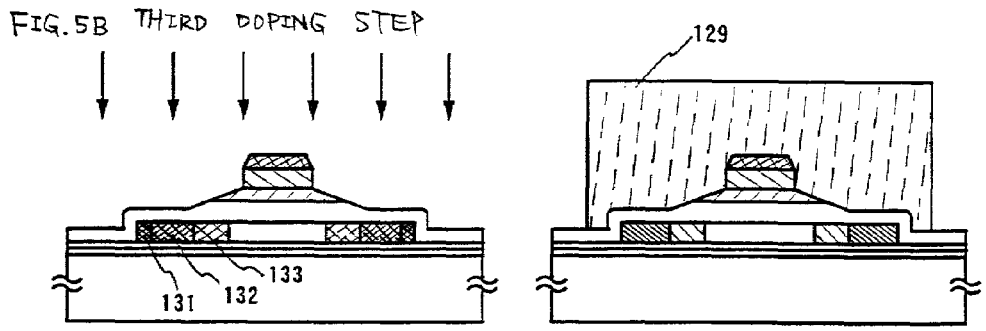
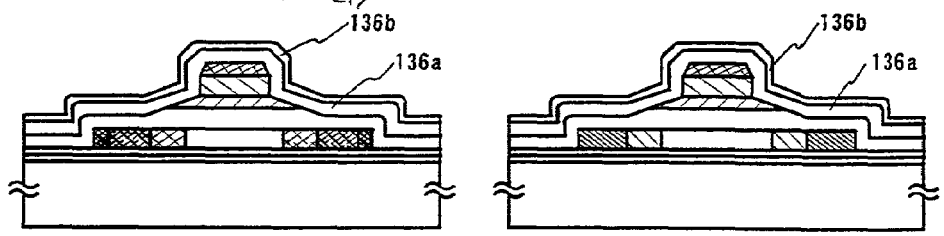
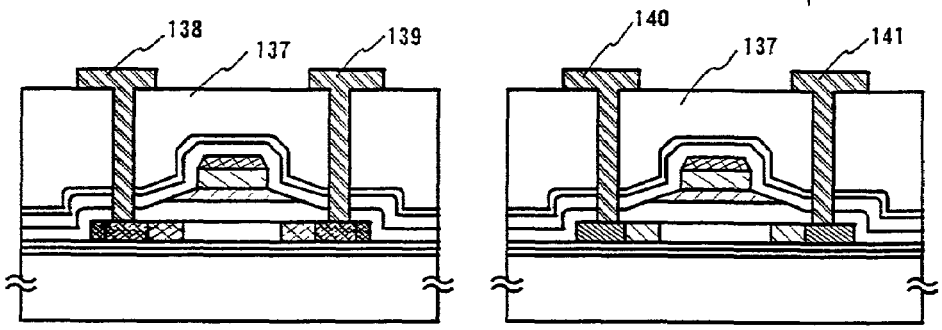

FIG. 6A SECOND DOPING STEP
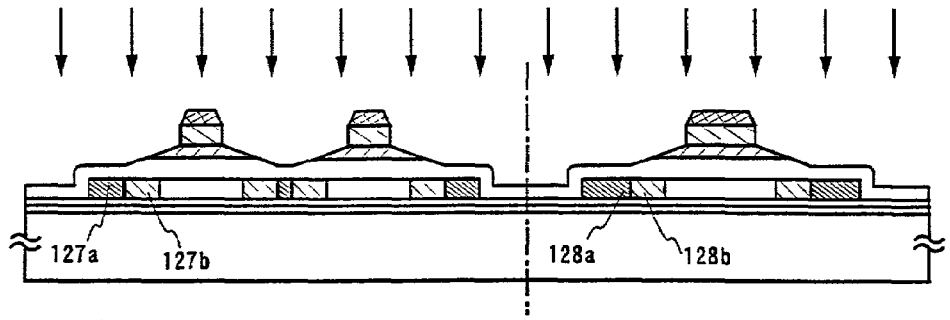
FIG. 6B THIRD DOPING STEP
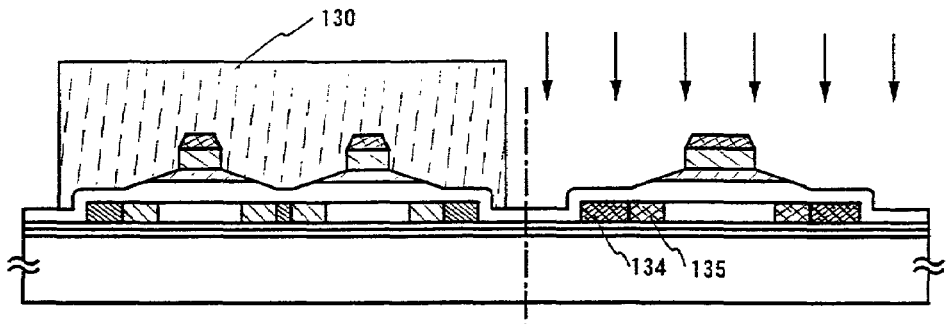
FIG. 6C FORMATION OF FIRST INTERLAYER INSULATING FILM / ACTIVATION STEP USING YAG LASER / HYDROGENATION STEP
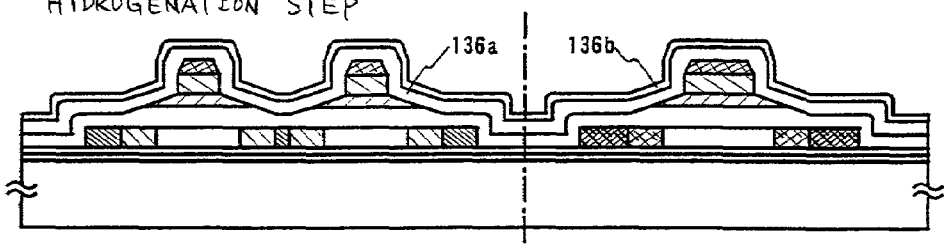
FIG. 6D FORMATION OF SECOND INTERLAYER INSULATING FILM / FORMATION OF CONTACT HOLE / FORMATION OF WIRING
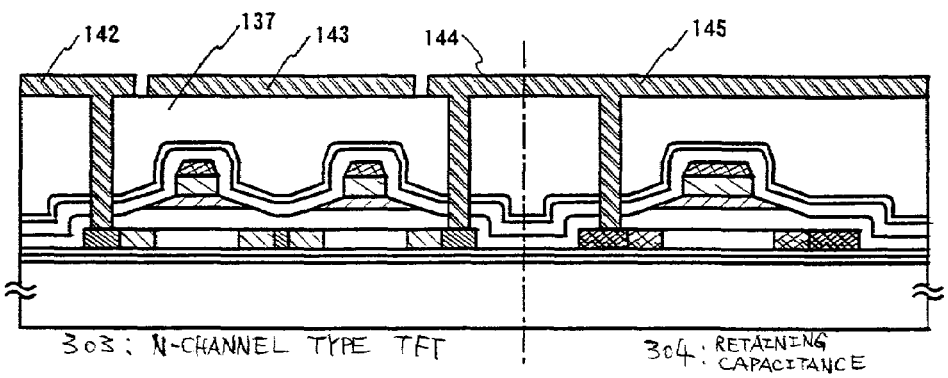
303: N-CHANNEL TYPE TFT
PIXEL TFT
304: RETAINING CAPACITANCE
306: PIXEL SECTION

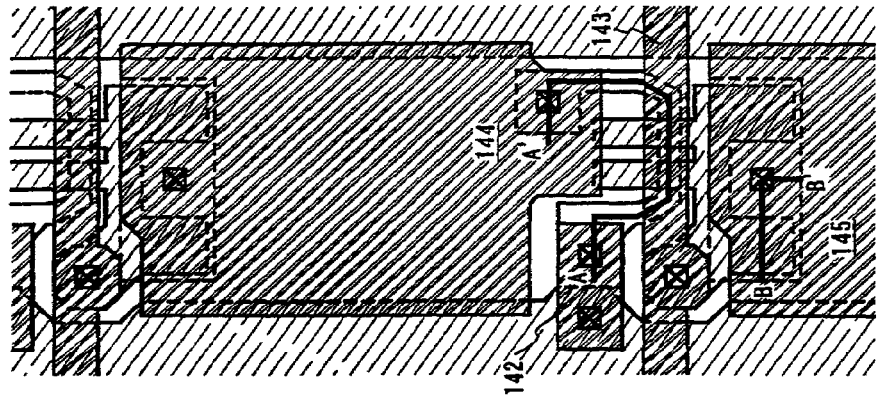
FIG. 7C FORMATION OF CONNECTION WIRING AND PIXEL ELECTRODE (STATE OF FIG. 3D AND FIG. 4D)
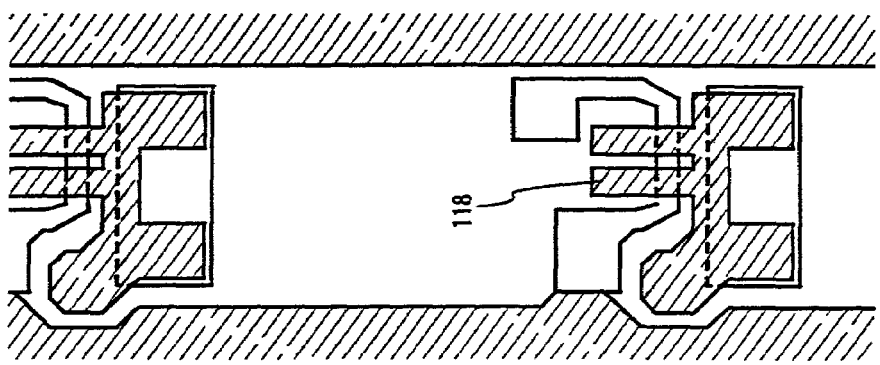
FIG. 7B FORMATION TO GATE ELECTRODE (STATE OF FIG. 3E AND FIG. 4E)
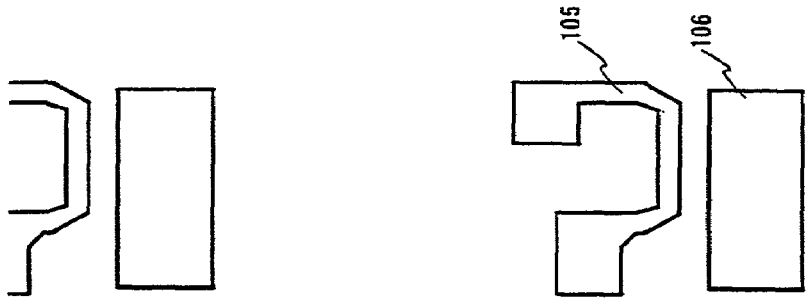
FIG. 7A FORMATION TO SEMICONDUCTOR LAYER (STATE OF FIG. 3B AND FIG. 4B)

FIG. 8(a) FORMATION OF GATE WIRING
FIG. 8(b) FORMATION OF GATE INSULATING FILM AND SEMICONDUCTOR FILM
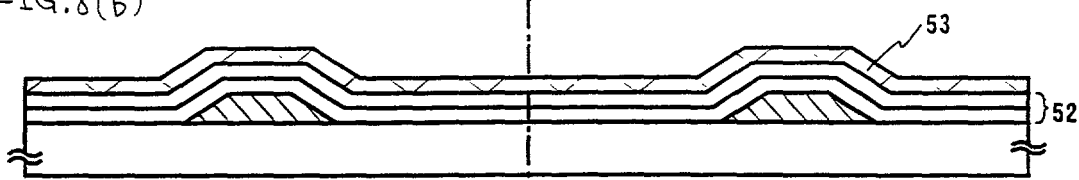
FIG. 8(c) CRYSTALLIZATION STEP
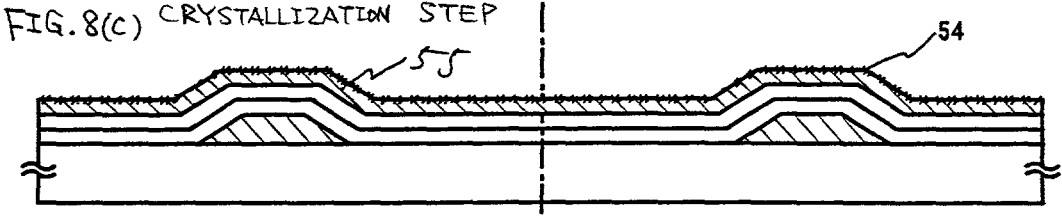
FIG. 8(d) GETTERING STEP
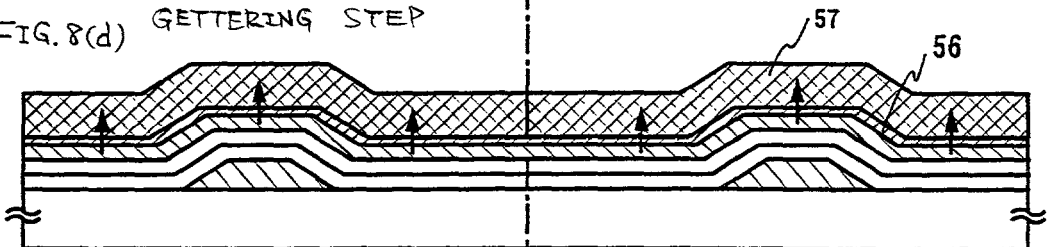
FIG. 8(e) STEP OF ADDING IMPURITY ELEMENT
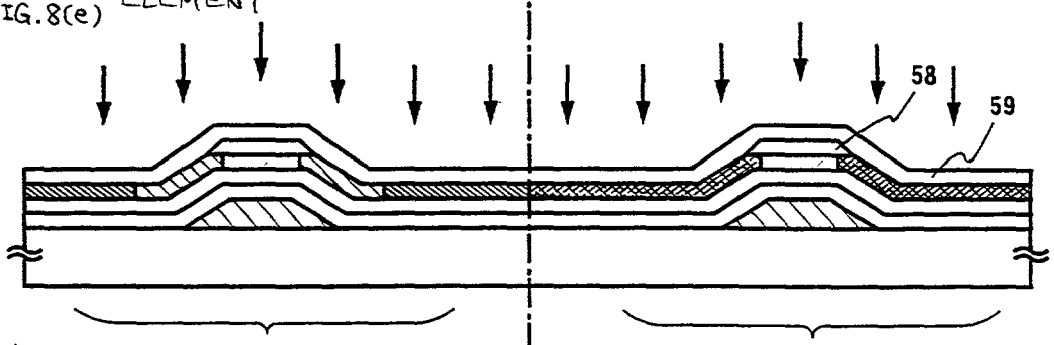
N-CHANNEL TYPE TFT | P-CHANNEL TYPE TFT FIG. 9(a) ACTIVATION STEP
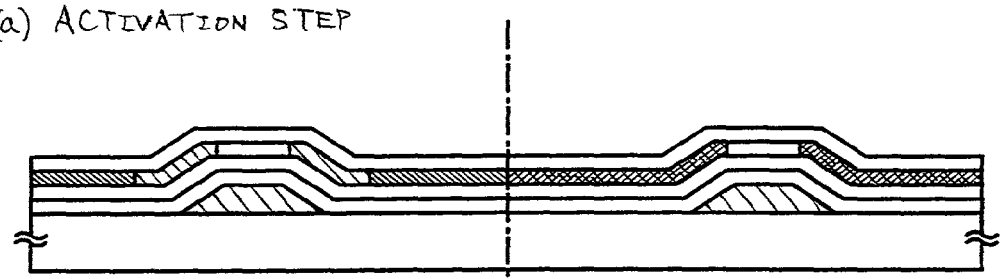
FIG. 9(b) STEP OF FORMING INTERLAYER INSULATING FILM
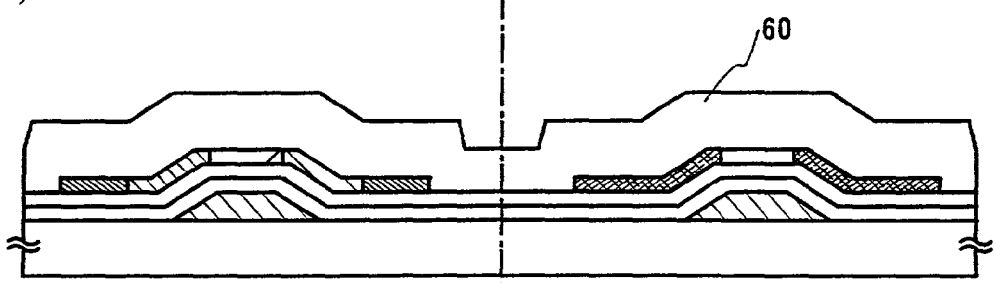
FIG. 9(c) STEP OF FORMING SOURCE WIRING OR DRAIN WIRING
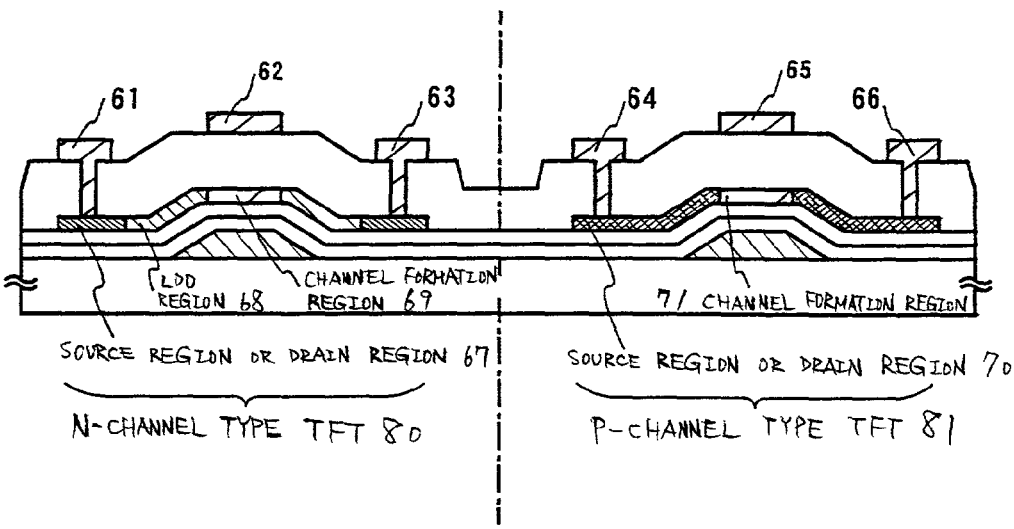

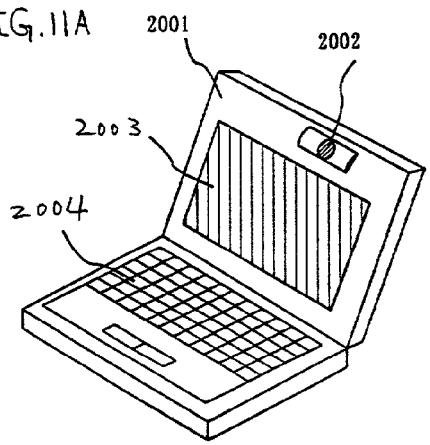
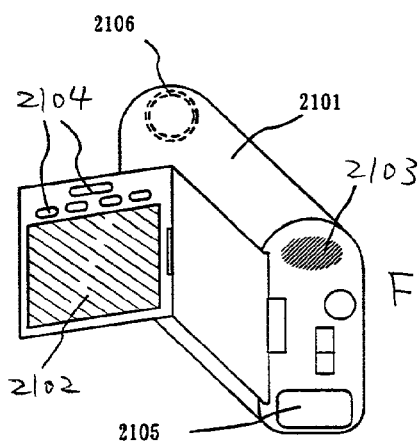
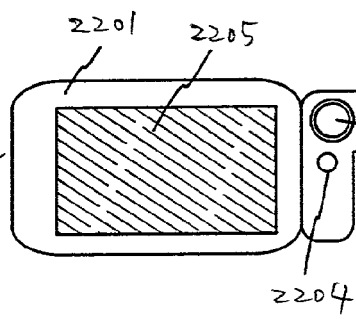
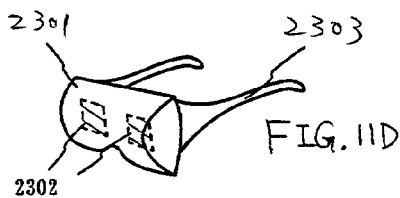
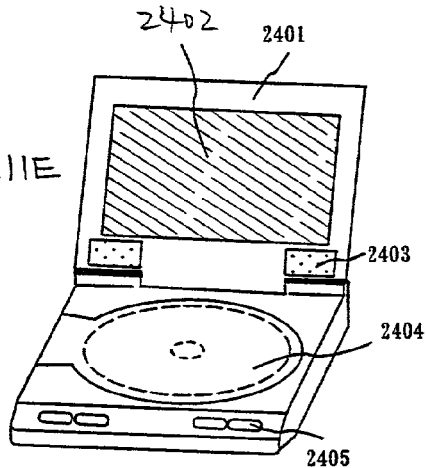
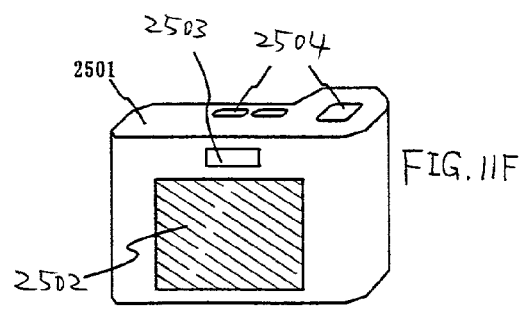

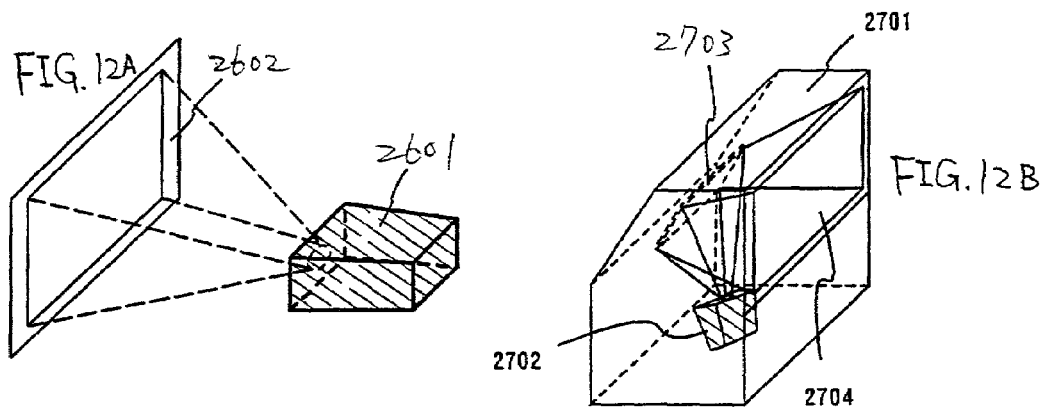
FIG. 12A
FIG. 12B
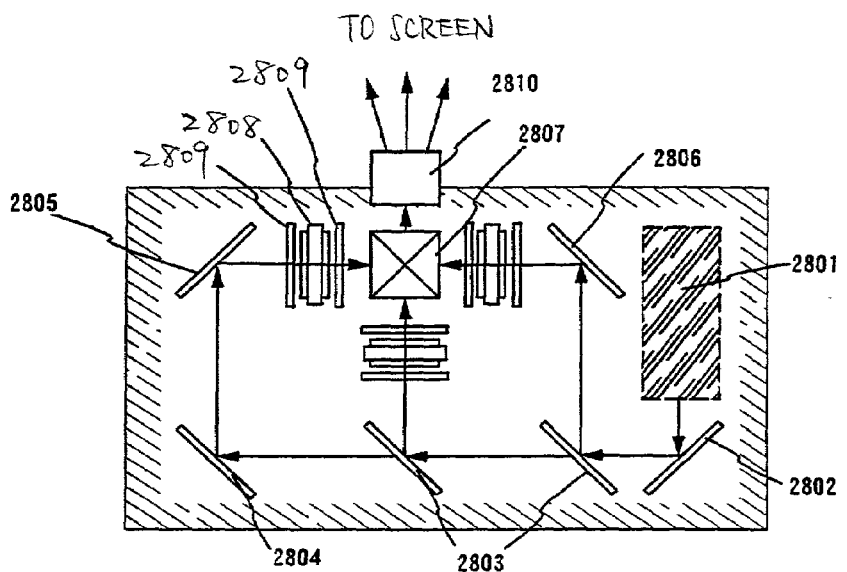
FIG. 12C PROJECTION DEVICE (THREE PLATE TYPE)
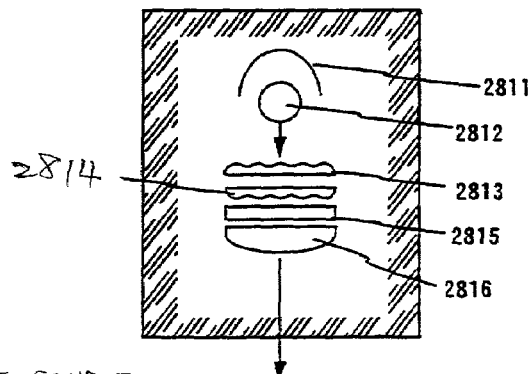
FIG. 12D LIGHT SOURCE OPTICAL SYSTEM

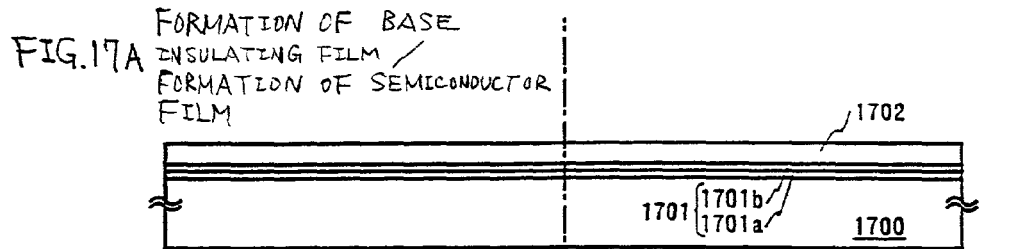

FIG. 17A FORMATION OF BASE INSULATING FILM / FORMATION OF SEMICONDUCTOR FILM

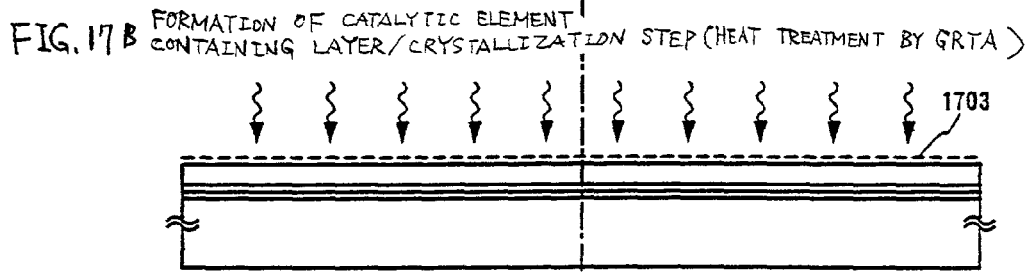

FIG. 17B FORMATION OF CATALYTIC ELEMENT CONTAINING LAYER / CRYSTALLIZATION STEP (HEAT TREATMENT BY GRTA)

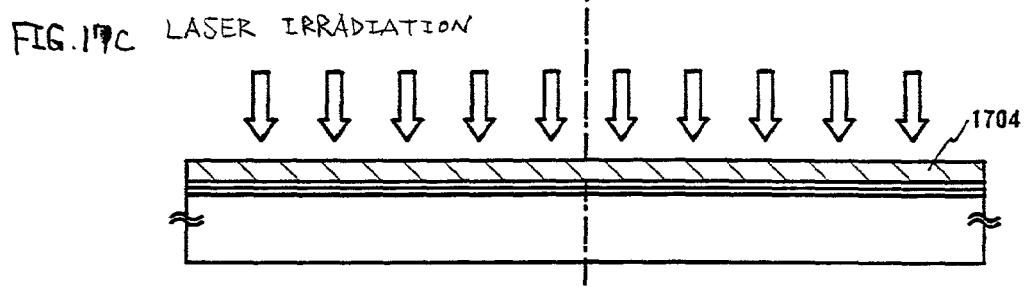

FIG. 17C LASER IRRADIATION

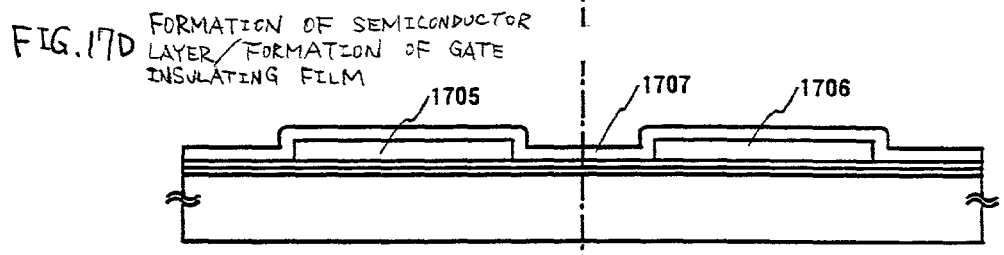

FIG. 17D FORMATION OF SEMICONDUCTOR LAYER / FORMATION OF GATE INSULATING FILM

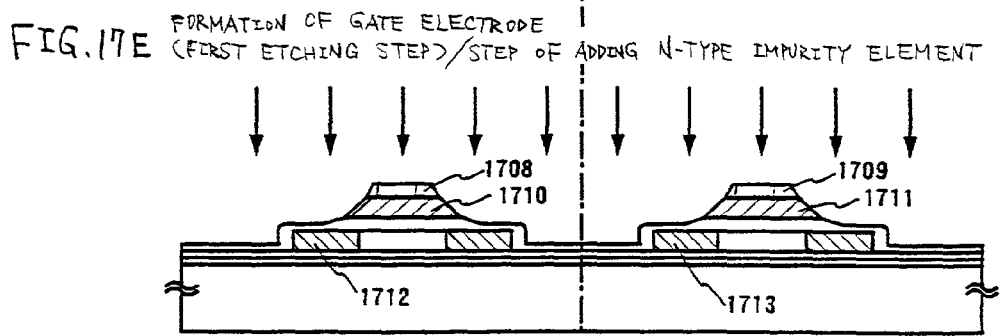

FIG. 17E FORMATION OF GATE ELECTRODE (FIRST ETCHING STEP) / STEP OF ADDING N-TYPE IMPURITY ELEMENT

FIG. 18A STEP OF SECOND ETCHING OF GATE ELECTRODE / STEP OF ADDING N-TYPE IMPURITY ELEMENT

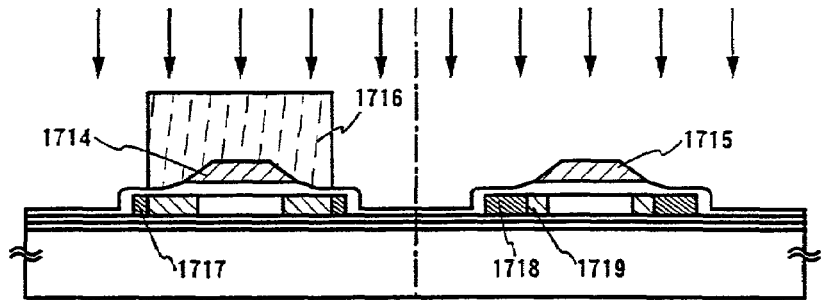

FIG. 18B STEP OF ADDING P-TYPE IMPURITY ELEMENT

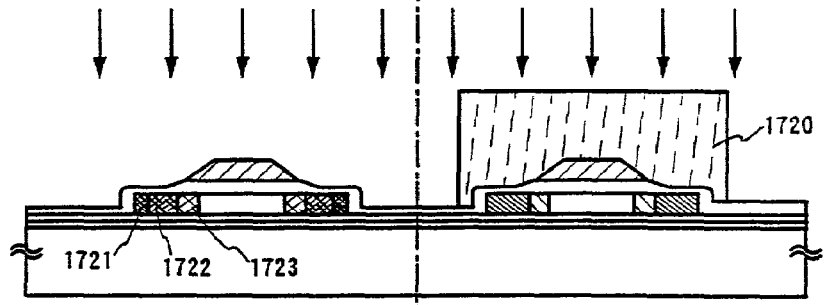

FIG. 18C FORMATION OF FIRST INTERLAYER INSULATING FILM / ACTIVATION PROCESS (HEAT TREATMENT BY GRTA) / HYDROGENATION PROCESS

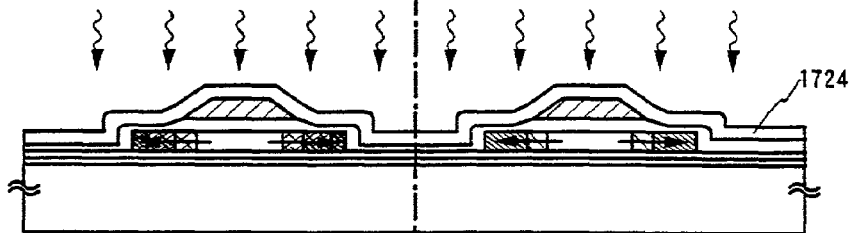

FIG. 18D FORMATION OF SECOND INTERLAYER INSULATING FILM / FORMATION OF CONTACT HOLE / FORMATION OF WIRING

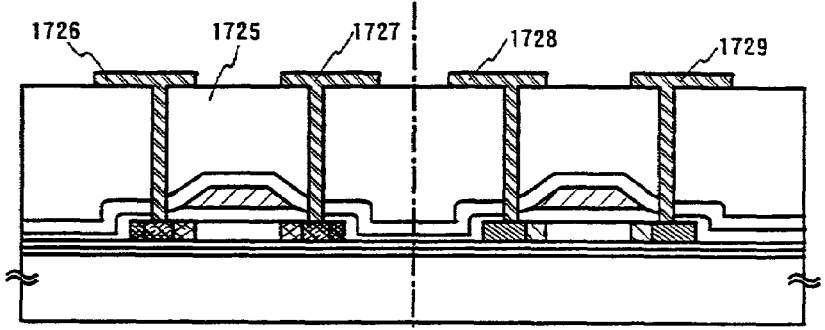

P-CHANNEL TYPE TFT 1730 | N-CHANNEL TYPE TFT 1731

PROCESS FOR MANUFACTURING A SEMICONDUCTOR DEVICE

BACKGROUND OF THE INVENTION

1. Field of the Invention

The present invention relates to a process for producing a semiconductor device using a semiconductor film having crystal structure, more specifically a process for producing a semiconductor device, a typical example of which is a thin film transistor (hereinafter referred to as a TFT). The semiconductor device in the present specification and claims means a device which functions by the use of semiconductor property.

2. Related Art

A monolithic liquid crystal display device wherein a crystalline silicon film is used as an active layer of TFTs to realize high electric field-effect mobility has been generally used as a display device. In the monolithic liquid crystal display device, pixel TFTs constituting a pixel section and TFTs of a driving circuit arranged around the pixel section are formed in a single glass substrate.

Elements which decide electrical characteristics of TFTs depend on the quality of a semiconductor film. Particularly electric field-effect mobility depends on the crystallinity of a semiconductor film. Electric field-effect mobility is directly concerned with the responsibility of TFTs and display ability of a liquid crystal display device produced using TFTs in its circuit. Therefore, researches on methods of forming a crystalline semiconductor film having good crystallinity have been continued. For example, the following method is used: a method of forming an amorphous semiconductor film once and subsequently crystallizing the film by irradiation with a laser ray, or a method of heating the amorphous semiconductor film in an electrically heating furnace to crystallize the film.

However, a semiconductor film formed by such a method is composed of many crystal grains, and the crystal orientation thereof extends in arbitrary directions and cannot be controlled. In this case, therefore, carriers move less smoothly than in a semiconductor made of a monocrystal. As a result, low electric field-effect mobility only can be obtained so that the electrical characteristics of TFTs are restricted.

Thus, in JP-A-7-183540, the Applicant discloses a technique wherein a silicon semiconductor film is crystallized by the addition of a metal element such as nickel, the fact that the metal element has effects of functioning as a catalyst to promote crystallization and lowering required temperature, and a technique wherein crystal orientation can be heightened.

However, the above-mentioned crystallizing method using the metal element having catalyst effect (called the catalyst element herein) has the following problems: the metal element remains in the semiconductor film or on the surface thereof so that the electrical characteristics of TFTs are scattered; the off-state current of the TFTs increases; and the electrical characteristics of individual elements are scattered.

Thus, the Applicant discloses a process of adopting a gettering technique using phosphorus to remove a metal element added to an amorphous silicon film in the step of crystallization from a semiconductor film (particularly from its channel-formed region) even at a heating temperature of about 500° C. For example, by adding phosphorus to the source/grain regions of TFTs and then heat-treating the resultant at 450 to 700° C., a metal element added for crystallization can easily be removed from an element-formed region. This technique about gettering of the catalyst element is disclosed in Japanese Patent No. 3032801.

As described above, the Applicant discloses a process of adopting a low-temperature crystallizing process using a catalyst element and subsequently gettering the catalyst element from a semiconductor film. For example, the following methods are considered: a method of forming a gettering site doped with a group XV element having gettering effect, a typical example of which is phosphorus, at a high concentration, performing heat treatment to move a catalyst element to the gettering site, and subsequently removing the gettering site; and a method of performing a heat treatment step for activating phosphorus added to a region which will be a source region or a drain source afterwards and simultaneously gettering a catalyst element in a semiconductor layer into the source region or the drain region. In these gettering steps, the metal element for crystallization, which is introduced into the semiconductor film, can be removed by performing heat treatment at 550° C. for about 4 hours.

However, in order to satisfy an increase in demand of display devices using TFTs as their circuit, it is necessary to establish a production process so that it can improve productivity and reduce production costs. In order to improve the efficiency of production steps, it has become possible to produce plural TFT substrates from a single large-sized glass substrate (for example, six 12.1-inch type TFT substrates from a 550×650 mm substrate), as illustrated in FIG. 16. However, there is still demanded a technique for producing many TFT substrates from a larger-sized glass substrate or for improving the efficiency of production steps (making the time for production steps short).

The concentration of phosphorus added to the semiconductor film to gain gettering effect is $10^{20}/cm^3$ or more, preferably $1\times10^{21}/cm^3$. The addition of phosphorus having a high concentration by ion implantation or by ion doping, which means a method wherein ions to be implanted are not subjected to mass separation in the present specification, causes a problem that subsequent recrystallization of the semiconductor film becomes difficult. Furthermore, the time required for the doping is also brought into a problem.

SUMMARY OF THE INVENTION

Thus, an object of the present invention is to solve such problems and provide a technique of removing a catalyst element (metal element) effectively from a crystalline semiconductor film obtained using the catalyst element without increasing the number of steps.

In order to provide a process for obtaining a high-quality crystalline semiconductor film with a high productivity, the present invention provides a process for manufacturing a semiconductor device, comprising the step of adding a catalyst element to an amorphous semiconductor film, heating an inert gas to a desired temperature, and performing a heat treatment in the heated gas, thereby yielding a crystalline semiconductor film.

In order to remove the catalyst used for the crystallization from the crystalline semiconductor film, particularly regions which will be channel-formed regions of TFTs afterwards, or reduce the concentration of the catalyst element, the present invention provides a process for manufacturing a semiconductor device comprising the step of heating an inert gas to a desired temperature, and performing a heat treatment in this heated gas.

The present invention is a process for manufacturing a semiconductor device, comprising the steps of:

forming an amorphous semiconductor film on an insulating surface, adding a catalyst element for promoting crystallization to the amorphous semiconductor film, and performing a first heat treatment in an inert gas to form a crystalline semiconductor film, forming a barrier layer on the crystalline semiconductor film, forming a semiconductor film containing a rare gas element on the barrier layer, performing a second heat treatment in an inert gas to move the catalyst remaining in the crystalline semiconductor film to the semiconductor film, removing the semiconductor film, and removing the barrier layer.

The present invention is also a process for manufacturing a semiconductor device, comprising the steps of:

forming an amorphous semiconductor film on an insulating surface, adding a catalyst element for promoting crystallization to the amorphous semiconductor film, and performing a first heat treatment in a heated inert gas to form a crystalline semiconductor film, forming a barrier layer on the crystalline semiconductor film, forming a semiconductor film containing a rare gas element on the barrier layer, performing a second heat treatment in a heated inert gas to move the catalyst remaining in the crystalline semiconductor film to the semiconductor film, removing the semiconductor film, and removing the barrier layer.

The present invention is also a process for manufacturing a semiconductor device, comprising the steps of:

forming an amorphous semiconductor film on an insulating surface, adding a catalyst element for promoting crystallization to the amorphous semiconductor film, and performing a first heat treatment in an inert gas to form a crystalline semiconductor film, irradiating the crystalline semiconductor film with a laser ray, forming a barrier layer on the crystalline semiconductor film, forming a semiconductor film containing a rare gas element on the barrier layer, performing a second heat treatment in an inert gas to move the catalyst remaining in the crystalline semiconductor film to the semiconductor film, removing the semiconductor film, and removing the barrier layer.

The present invention is also a process for manufacturing a semiconductor device, comprising the steps of:

forming an amorphous semiconductor film containing oxygen and carbon at a concentration of $5 \times 10^{18}/cm^3$ or less on an insulating surface, adding a catalyst element for promoting crystallization to the amorphous semiconductor film, and performing a first heat treatment in an inert gas to form a crystalline semiconductor film, forming a barrier layer on the crystalline semiconductor film, forming a semiconductor film containing a rare gas element on the barrier layer, performing a second heat treatment in an inert gas to move the catalyst remaining in the crystalline semiconductor film to the semiconductor film, removing the semiconductor film, and removing the barrier layer.

The present invention is also a process for manufacturing a semiconductor device, comprising the steps of:

forming an amorphous semiconductor film containing oxygen and carbon at a concentration of $5 \times 10^{18}/cm^3$ or less on an insulating surface, adding a catalyst element for promoting crystallization to the amorphous semiconductor film, and performing a first heat treatment in an inert gas to form a crystalline semiconductor film, irradiating the crystalline semiconductor film with a laser ray, forming a barrier layer on the crystalline semiconductor film, forming a semiconductor film containing a rare gas element on the barrier layer, performing a second heat treatment in an inert gas to move the catalyst remaining in the crystalline semiconductor film to the semiconductor film, removing the semiconductor film, and removing the barrier layer.

The present invention is also a process for manufacturing a semiconductor device, comprising the steps of:

forming an amorphous semiconductor film containing oxygen and carbon at a concentration of $5 \times 10^{18}/cm^3$ or less on an insulating surface, adding a catalyst element for promoting crystallization to the amorphous semiconductor film, and performing a first heat treatment in a heated inert gas to form a crystalline semiconductor film, irradiating the crystalline semiconductor film with a laser ray, forming a barrier layer on the crystalline semiconductor film, forming a semiconductor film containing a rare gas element on the barrier layer, performing a second heat treatment in a heated inert gas to move the catalyst remaining in the crystalline semiconductor film to the semiconductor film, removing the semiconductor film, and removing the barrier layer.

The semiconductor film on the barrier layer may contain the rare gas element at a concentration of $1 \times 10^{19}$ to $2 \times 10^{22}/cm^3$.

The semiconductor film may contain oxygen at a concentration of $5 \times 10^{17}$ to $1 \times 10^{21}/cm^3$.

To the semiconductor film may be added at least one selected from the rare gas element and carbon at a concentration of $1 \times 10^{19}$ to $2 \times 10^{22}/cm^3$.

In the first heat treatment the inert gas may be heated at 600 to 800° C.

In the second heat treatment the inert gas may be heated at 500 to 700° C.

The semiconductor film may have a film thickness of 5 nm or more.

The inert gas may be one or more selected from nitrogen ($N_2$), argon (Ar), helium (He), neon (Ne), krypton (Kr), and xenon (Xe).

The barrier layer may be a chemical oxide made from ozone water.

The barrier layer may be formed by oxidization of the surface of the amorphous semiconductor film by plasma treatment.

The barrier layer may be formed by oxidizing the surface of the amorphous semiconductor film with ozone generated by irradiation of the inside of an atmosphere containing oxygen with ultraviolet rays.

The barrier layer may be a porous film formed to have a film thickness of 1 to 10 nm.

The barrier layer may be a film formed by plasma CVD.

The rare gas element may be one or more selected from helium (He), neon (Ne), argon (Ar), krypton (Kr), and xenon (Xe).

The catalyst element may be one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

BRIEF DESCRIPTION OF THE DRAWINGS

FIGS. 1A to 1E are views illustrating an embodiment of the present invention.

FIGS. 2A to 2D are views illustrating an embodiment of the present invention.

FIGS. 3A to 3E are views illustrating an example of the present invention.

FIGS. 4A to 4E are views illustrating an example of the present invention.

FIGS. 5A to 5D are views illustrating an example of the present invention.

FIGS. 6A to 6D are views illustrating an example of the present invention.

FIGS. 7A to 7C are views illustrating an embodiment of the present invention.

FIGS. 8a to 8e are views illustrating an embodiment of the present invention.

FIGS. 9a to 9c are a graph showing measured results of the concentration of Ar contained in a semiconductor film.

FIGS. 11A to 11F are views illustrating electrical equipments using, as a display section, a liquid crystal display device manufactured by the present invention.

FIGS. 12A to 12D are views illustrating electrical equipments using, as a display section, a liquid crystal display device manufactured by the present invention.

FIGS. 17A to 17E are views illustrating an embodiment of the present invention.

FIGS. 18A to 18D are views illustrating an embodiment of the present invention.

PREFERRED EMBODIMENTS OF THE INVENTION

Embodiment 1

Figure 10:
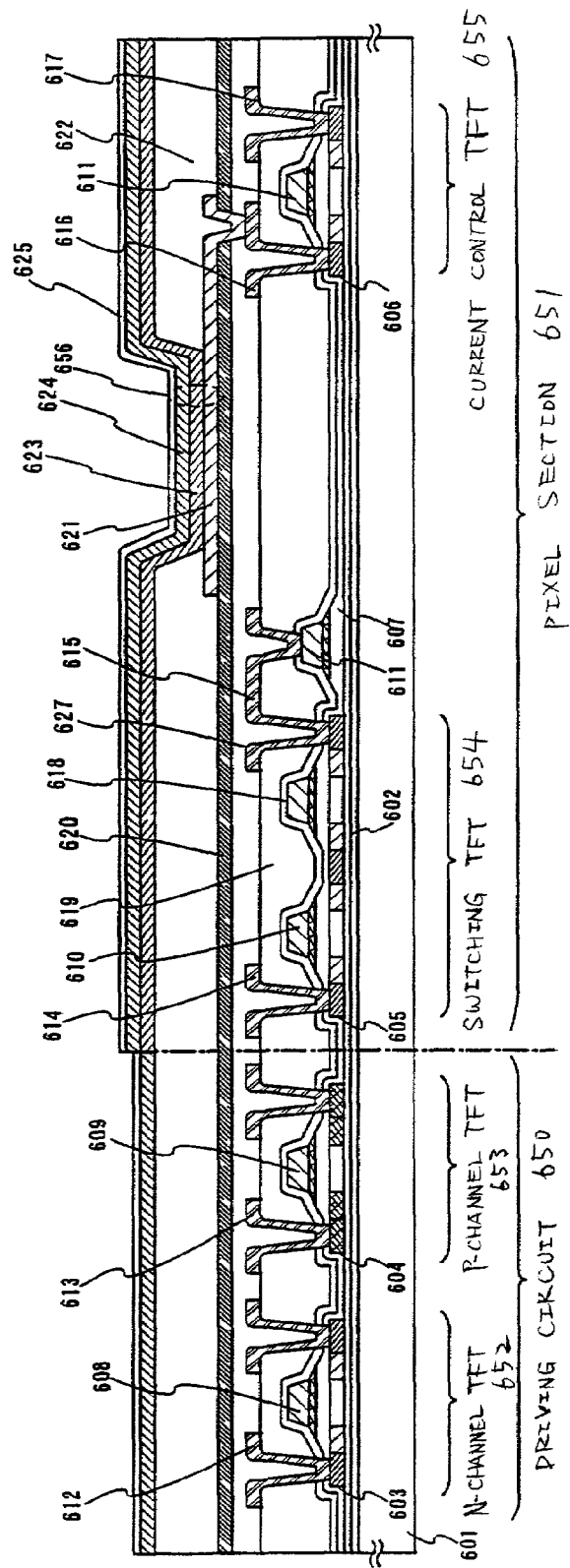
FIG. 10 is a view illustrating an example of a luminescent device manufactured by the application of the present invention.

Referring to FIGS. 1, the following will describe a process of adding a metal element having catalyst effect on the entire surface of an amorphous semiconductor film to crystallize the amorphous semiconductor film, forming a semiconductor film containing a rare gas element (Ar in the present example), and then using this film as a gettering site.

In FIG. 1A, the material of a substrate 10 is not particularly limited, and is preferably barium borosilicate glass, alumino borosilicate glass or quartz. An inorganic insulating film as an underlying insulating film may be formed on the surface of the substrate 10 to have a thickness of 10 to 200 nm. As the inorganic insulating film, an oxynitride silicon film produced from $SiH_4$, $NH_3$ and $N_2O$ by plasma CVD is used in the present embodiment. The underlying insulating film 11 is a film for preventing alkali metals contained in the glass substrate from diffusing into a semiconductor film which will be formed thereon. Thus, the step of forming the underlying insulating film can be omitted in the case of using a quartz substrate.

Next, an amorphous semiconductor film 12 is formed. As the amorphous semiconductor film, there may be used a film made of a semiconductor material the main component of which is silicon, typically an amorphous silicon film or an amorphous silicon germanium film ($Si_xGe_{1-x}$). The method of forming the film may be plasma CVD, reduced-pressure CVD or sputtering. The thickness of the film is set to 10–100 nm. In order to obtain a high-quality crystalline semiconductor film, the concentration of impurities, such as oxygen, nitrogen and carbon, contained in the amorphous semiconductor film 12 is preferably set to $5\times10^{18}/cm^3$ or less, and more preferably $1\times10^{18}/cm^3$ or less. Furthermore, in order to obtain a higher-quality crystalline semiconductor film, it is important that the concentration of oxygen in the amorphous semiconductor film 12 is $5\times10^{18}/cm^3$ or less, preferably $1\times10^{18}/cm^3$ or less. This is because if the concentration of oxygen in the amorphous semiconductor film is high, a catalyst element (particularly, nickel) used in the next crystallizing step is not easily released.

Thereafter, a catalyst element having the effect of promoting crystallization is added to the surface of the amorphous silicon film 12 (FIG. 1A). Examples of the catalyst element include nickel (Ni), iron (Fe), cobalt (Co), ruthenium (Ru), rhodium (Rh), palladium (Pd), osmium (Os), iridium (Ir), platinum (Pt), copper (Cu) and gold (Au). One or more selected these elements may be used. Nickel is typically used. A catalyst-containing layer 13 is formed by applying a nickel acetate solution containing 1 to 100 ppm by weight of nickel with a spinner. In order to make the wettability of the solution high in this case, the following surface-treatment step is performed: the step of forming a very thin oxidized film from an aqueous ozone-containing solution; etching the oxidized film with a mixed solution of hydrofluoric acid and hydrogen peroxide water to form a clean surface; and subsequently treating the surface again with an aqueous ozone-containing solution to form a very thin oxidized film. Since the surface of a semiconductor film such as a silicon film is originally hydrophobic, the above-mentioned formation of the oxidized film enables uniform coating of the nickel acetate solution. Of course, the method of forming the catalyst-containing layer 13 is not limited to the above-mentioned method. The layer 13 may be formed by sputtering, vapor deposition, plasma treatment or the like. Before the formation of the amorphous silicon film 12, the catalyst-containing layer may be formed on the underlying insulating film 11.

Next, heat treatment (first heat treatment) for crystallizing the amorphous semiconductor film is performed in the state that contact of the amorphous silicon film 12 with the catalyst-containing layer 13 is kept.

Figure 14:
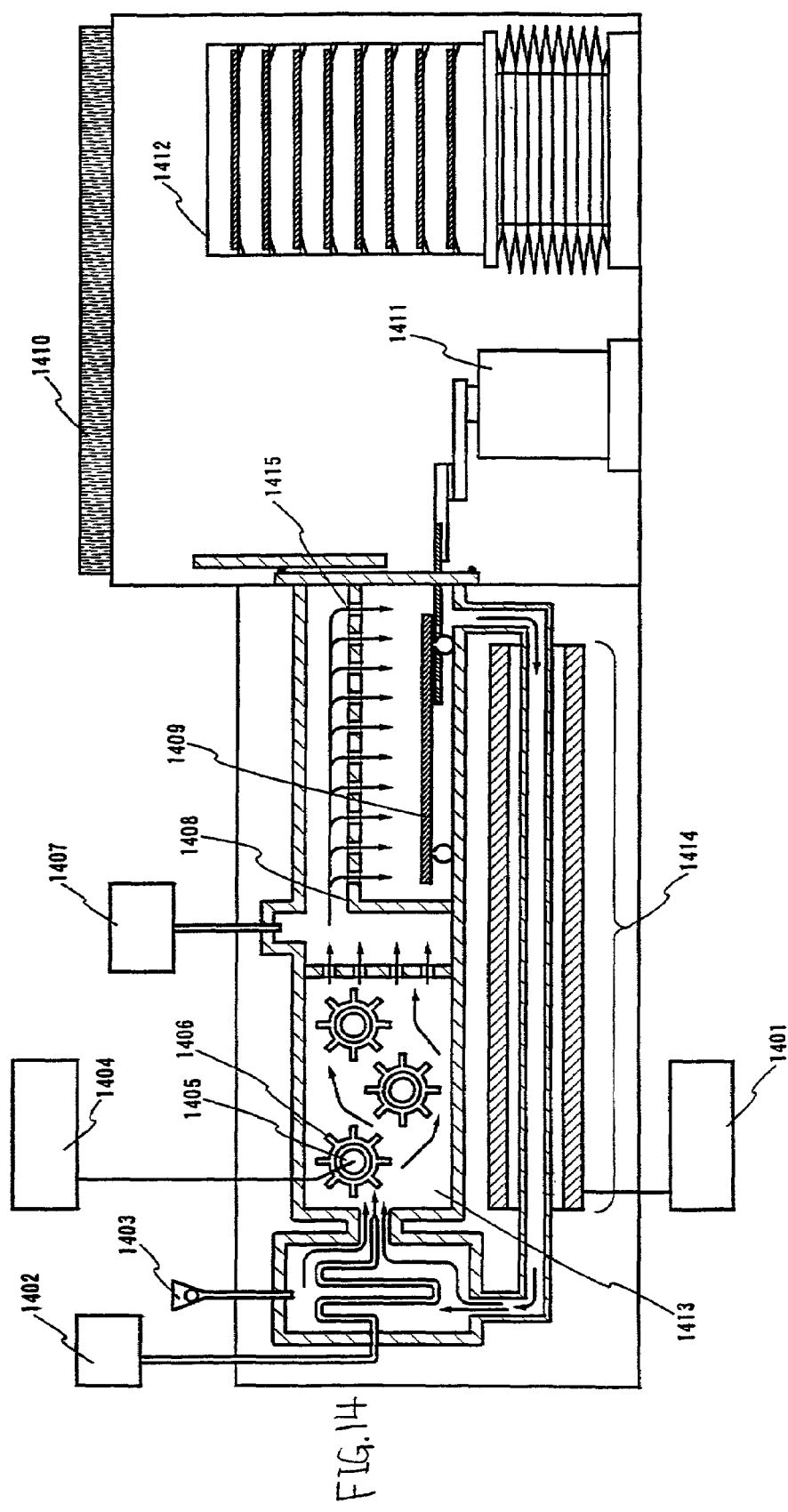
FIG. 14 is a view illustrating the outline of a heat treatment apparatus used in the present invention.
Figure 15:
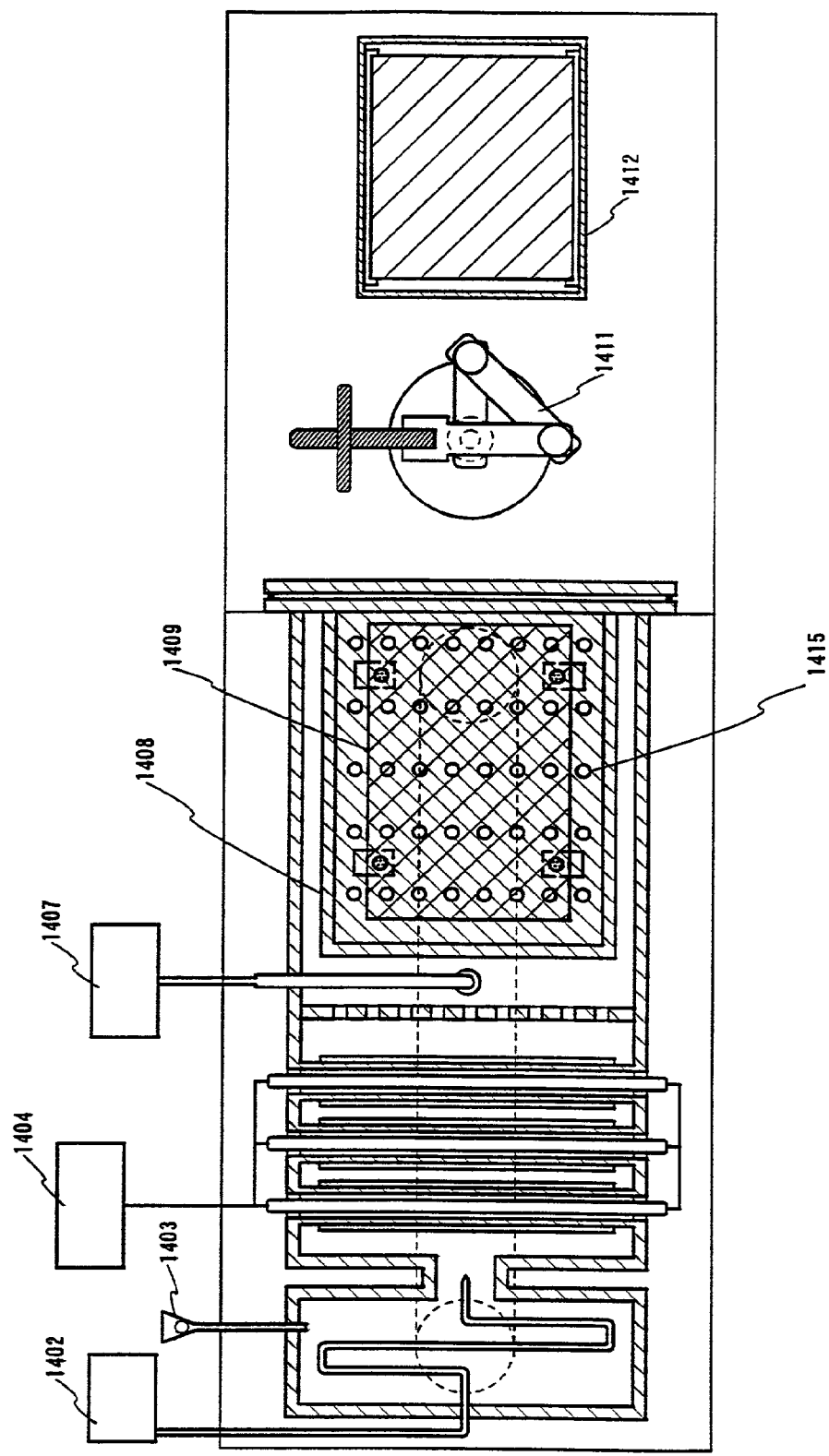
FIG. 15 is a view illustrating the outline of a heat treatment apparatus used in the present invention.
Figure 16:
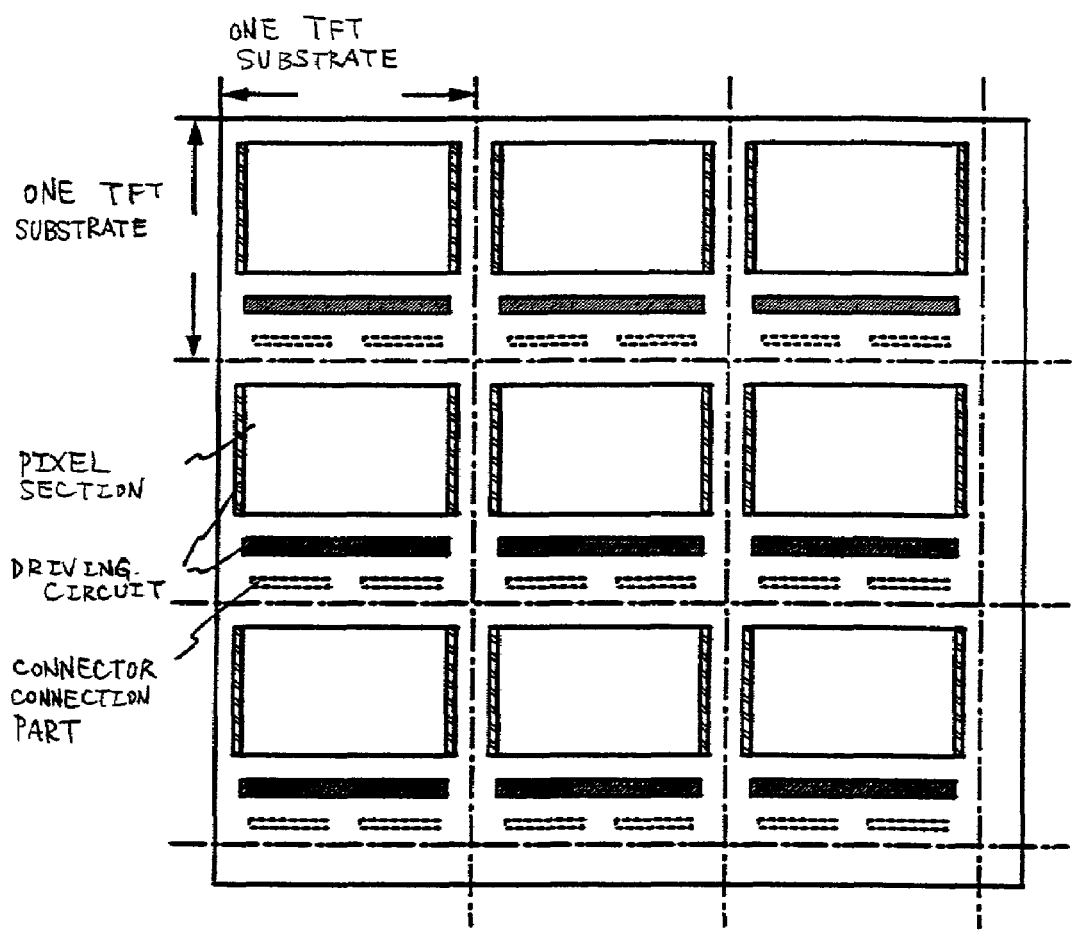
FIG. 16 is views illustrating plural TFT substrates formed on a glass substrate.

In the first heat treatment, a crystalline semiconductor film (crystalline silicon film) 14 is formed by heat treatment using an apparatus as illustrated in FIGS. 14 and 15. In the specification, a method of heating an inert gas by a heating means such as a heater or a light source to set the temperature thereof to a desired temperature, and heating a substrate to be treated through the heated gas is referred to as a GRTA (gas-rapid thermal annealing) method hereinafter.

In the GRTA method, an inert gas heated to 600–800° C. is blown against the substrate to be treated for 30 seconds to 5 minutes, thereby conducting heat treatment to perform crystallization. In the present embodiment, an inert gas (nitrogen) heated to 650° C. is used to conduct heat treatment for 90 seconds. In this way, the semiconductor film is crystallized to yield a crystalline semiconductor film 14.

In order to make the crystallinity of the crystalline semiconductor film high, a laser ray may be applied thereto. As the laser ray, an excimer laser having a wavelength of 400 nm or less is used. A pulse laser having a repeating wavelength of about 10 to 1000 Hz is concentrated through an optical system so as to have energy of 100 to 400 mJ/cm$^2$. The laser is applied to the crystalline silicon film 14 at an overlap ratio of 90 to 95%. A second or third harmonic wave of a YAG laser may be used besides the excimer laser.

In the thus-obtained crystalline silicon film 15, the catalyst element used in the crystallizing step remains at an average concentration over $1 \times 10^{19}$/cm$^3$. In such a state, various semiconductor elements including TFTs can be formed. However, characteristics of the formed semiconductor elements are not very good Thus, by gettering, the catalyst element is removed from the crystalline silicon film or the concentration of the catalyst element in the crystalline silicon film is reduced.

As illustrated in FIG. 1D, a thin layer 16 is firstly formed on the surface of the crystalline semiconductor film 15. In the specification, the thin layer 16 formed on the crystalline semiconductor film 15 is a layer formed in order that the first semiconductor film will not be etched when a gettering site is removed afterwards, and is called the barrier layer 16.

The thickness of the barrier layer 16 is set to about 1 to 10 nm. Conveniently, a chemical oxide formed by treatment with ozone water may be formed as the barrier layer. In the same manner, the chemical oxide may be formed by treatment with an aqueous solution wherein sulfuric acid, hydrochloric acid, nitric acid or the like is mixed with hydrogen peroxide water. In a different way, ozone maybe generated by plasma treatment in an oxidizing atmosphere or irradiation with ultraviolet rays in an oxygen-containing atmosphere, so as to perform oxidizing treatment. A thin oxidized film as the barrier layer may be formed by heating the semiconductor film at about 200 to 350° C. in a clean oven. Alternatively, plasma CVD, sputtering, vapor deposition or the like may be used to form a thin oxidized film having a thickness of about 1 to 5 nm, as the barrier layer. In any case, it is advisable to use the following film: a film which enables the catalyst element to move to the side of the gettering site in a subsequent gettering step and which does not permit etching solution to be infiltrated into this film itself (protects the crystalline semiconductor film 15 from etching solution) in a subsequent step of removing the gettering site, for example, a chemical oxide film formed by treatment with ozone water, a silicon oxide film (SiOx) or a porous film.

Next, as the gettering site, a semiconductor film 17 is formed on the barrier layer 16. The semiconductor film 17 is a semiconductor film (typically an amorphous silicon film) which is formed by sputtering, contains therein a rare gas element having a concentration of $1 \times 10^{20}$/cm$^3$ or more, preferably $2 \times 10^{20}$/cm$^3$ or more, and has a thickness of 20 to 250 nm (FIG. 1D). Since nickel trends to move to a region having a high oxygen concentration, the gettering efficiency of the semiconductor film 17 may be improved by incorporating oxygen (concentration measured by SIMS analysis: $5 \times 10^{17}$/cm$^3$ to $1 \times 10^{21}$/cm$^3$) into the film 17. Since the gettering site 17 is removed afterwards, the site 17 is preferably a film having a small density and an etching selection ratio largely different from the etching selection ratio of the crystalline semiconductor film 15. Alternatively, the semiconductor film 17 containing a rare gas element may be formed by plasma CVD under the following film-forming conditions: ingredient gas: Ar and SiH$_4$ (flow rate of Ar to SiH$_4$=500/100 sccm); film-forming pressure: 33.3 Pa, power: 35 W, and substrate temperature: 300° C.

Next, the resultant lamination is subjected to a heating treatment (second heat treatment) in an inert gas heated to 500 to 700° C., thereby performing gettering. In the present embodiment, the lamination is subjected to a heat treatment in an inert gas heated to 650° C. for 5 minutes, so that the catalyst element in the crystalline semiconductor film 15 can be moved to the gettering site (the semiconductor film containing the rare gas) 17. As described above, a crystalline semiconductor film 18 wherein the concentration of the catalyst element is reduced to $1 \times 10^{17}$/cm$^3$ or less can be obtained.

After the semiconductor film 17 containing the rare gas is formed, a rare gas element or rare gas elements described below may be added to this semiconductor film 17 by ion doping, so as to form a gettering site containing the rare gas element(s) having a concentration of $1 \times 10^{20}$/cm$^3$ or more, preferably $2 \times 10^{20}$/cm$^3$. The rare gas element(s) may be one or more selected from helium (He), neon (Ne), argon (Ar), krypton (Kr), and xenon (Xe). By forming the semiconductor film 17 containing the rare gas, and subsequently adding a rare gas having a different atomic size as described above, the barrier layer 16 can be made porous. By generating larger strain in the semiconductor film 17, the etching selection ratio of the semiconductor film 17 to the crystalline semiconductor film 15 can be made large.

Embodiment 2

FIGS. 2 are an explanatory view of an embodiment of the present invention. The embodiment is a process of forming a semiconductor film having crystal structure by heat treatment, and performing gettering in the same step.

An amorphous semiconductor film 203 is firstly formed on an underlying insulating film 201 by plasma CVD, reduced pressured CVD or sputtering, to have a thickness of 10 to 100 nm. Next, a catalyst element-containing layer is formed. Alternatively, before the amorphous semiconductor film is formed as illustrated in FIG. 2A, the catalyst element-containing layer may be formed by applying an aqueous solution or alcohol solution containing a catalyst element onto the underlying insulating film 201 or by sputtering, vapor deposition, plasma treatment or the like. Subsequently, a barrier layer 204 is formed on the amorphous semiconductor film 203. The method of the formation of these layers is the same as in Embodiment 1.

As illustrated in FIG. 2B, a semiconductor film 205 containing a rare gas element having a concentration of $1 \times 10^{20}$/cm$^3$ or more, preferably $2 \times 10^{20}$/cm$^3$ is formed thereon by plasma CVD or sputtering, to have a thickness of 25 to 250 nm. The semiconductor film 205 may contain oxygen having a concentration of $5 \times 10^{17}$/cm$^3$ or more (and $1 \times 10^{21}$/cm$^3$ or less). Typically, an amorphous silicon film is selected. Since this semiconductor film 205 will be removed afterwards, this film is desirably made up to a film having a low density.

The resultant lamination is subjected to a heat treatment at 500 to 800° C. for 30 seconds to 10 minutes by the GRTA method. Conditions including the concentration of the catalyst element added to the amorphous silicon film 202 may be appropriately decided. In the present embodiment, the heating treatment is performed by using an aqueous Ni solution having a concentration of 30 ppm to form the catalyst element-containing layer and then blowing an inert gas (nitrogen) heated to 610° C. against the layer.

By this heat treatment, the catalyst element is infiltrated into the semiconductor film 203 having amorphous structure. The catalyst element diffuses toward the semiconductor film 205 (in the direction shown by arrows in FIG. 2B) while the catalyst element causes the semiconductor film 203 to be crystallized. In this way, crystallization and gettering are simultaneously carried out by performing the heat treatment once.

Thereafter, the semiconductor film 205 is selectively etched and removed. The method of the etching may be dry etching with $ClF_3$ without using plasma, or wet etching with an alkali solution such as an aqueous solution containing hydrazine or tetraethylammonium hydroxide (chemical formula: $(CH_3)_4NOH$). In this case, the barrier layer 204 functions as an etching stopper. The barrier layer 204 may be removed afterwards with hydrofluoric acid.

As illustrated in FIG. 2C, it is possible to obtain a semiconductor film (first semiconductor film) 206 having crystal structure wherein the concentration of the catalyst element is reduced to $1 \times 10^{17}/cm^3$ or less. In order to make the crystallinity of this crystalline semiconductor film 206 high, in the same manner as in Embodiment 1 a laser ray is applied thereto as illustrated in FIG. 2D, so that a crystalline semiconductor film 207 having improved crystallinity can be produced.

The thus-formed crystalline semiconductor film 207 is made of crystal in a thin rod form or thin flat rod form on the basis of the effect of the catalyst element. The respective crystal grains thereof grow to have a specified orientation macroscopically.

Embodiment 3

Referring to FIGS. 14 and 15, the following will describe, as the present embodiment, a GRTA apparatus used in heating treatment.

FIG. 14 schematically illustrates a cross section of the GRTA apparatus, and FIG. 15 schematically illustrates a top view of the GRTA apparatus. Reference number 1401 represents a heater; 1402, an inert gas supply source; 1403, an air outlet for releasing excessive heat; 1404, a power source for controlling heat sources for heating the inert gas (examples of the heat sources: resistance heating elements composed of a compound such as silicon carbide or lanthanum chromate, or a metal wire such as a platinum, Nichrome or tungsten wire; metal heating elements; ceramic heating elements; or platinum heating elements); 1405, heat sources; 1406, a heat absorber; 1407, a gas supply source for cooling a substrate after heat treatment; 1408, a heat treatment chamber; 1409, a substrate to be treated; 1410, a clean oven; 1411, a robot; 1412, a substrate cassette; 1413, a gas heating section; 1414, a circulating section; and 1415, an inflow entrance for heated gas. The heat treatment chamber 1408 may be provided with a separate heat source.

The inert gas (nitrogen used in the present embodiment) supplied from the inert gas supply source 1402 passes through the gas heating section 1413 having the plural heat sources so as to be heated. The inert gas is blown against the substrate 1409 to be treated, sat which is put in the heat treatment chamber 1408.

By blowing the inert gas heated to 500 to 70020 C. in the gas heating chamber 1413 against the substrate 1409 for 1 to 10 minutes, it is possible to perform a heat treatment for crystallizing treatment of the substrate and gettering (removal of the catalyst element used upon the crystallizing treatment from the crystalline semiconductor film, or reduction in the concentration of the catalyst element).

The heat treatment may be performed in the inert gas by means of the heat sources set in the heat treatment chamber 1408.

Thereafter, the gas passes through the circulating section 1414 from the treatment chamber 1408, and arrives again at the gas heating section 1413. The circulating section 1414 is provided with the heater 1401, and the heater 1401 causes the gas passing through the circulating section 1414 not to be cooled very much.

After the finish of the heat treatment, an inert gas having a normal temperature is caused to flow from the cooling gas supply source 1407 to the treatment chamber 1408, in order to lower the temperature of the substrate to about 250° C. Thereafter, the substrate is taken out by the robot 1411 and further the substrate is cooled in the substrate cassette 1412 until the substrate temperature becomes a temperature at which the substrate can be put in the cassette.

As the heat sources 1405, there are used resistance heating elements composed of a compound such as silicon carbide or lanthanum chromate, or a metal wire such as a platinum, Nichrome or tungsten wire; metal heating elements; ceramic heating elements; or platinum heating elements. The heat absorber 1406 arranged around the heat sources 1405 conducts heat from the light source 1405 to the inert gas. Therefore, the heat absorber 1406 has a structure wherein the area contacting the inert gas is wide.

The above is general description on the GRTA apparatus, and specific conditions for the heat treatment will be described in respective Examples which will be described below.

EXAMPLES

Example 1

Referring to FIGS. 1, and 3 to 7, the following will describe a process of adding a metal element having a catalyst effect to the entire surface of an amorphous semiconductor film, using the GRTA apparatus to crystallize the film (a first heat treatment), forming a semiconductor film containing a rare gas element (Ar in the present example) and oxygen, and using this film, as a gettering site, and the GRTA apparatus to perform gettering (a second heat treatment).

In FIGS. 3A and 4A, the material of a substrate 100 is not particularly limited, and is preferably barium borosilicate glass, alumino borosilicate glass or quartz. An inorganic insulating film as an underlying insulating film 101 is formed on the surface of the substrate 100 to have a thickness of 10 to 200 nm. A preferred example of the underlying insulating film is an oxynitride silicon film produced by plasma CVD. Specifically, a first oxynitride silicon film is produced from $SiH_4$, $NH_3$ and $N_2O$ to have a thickness of 50 nm, and a second oxynitride silicon film is produced from $SiH_4$ and $N_2O$ to have a thickness of 100 nm. The underlying insulating film 101 is a film for preventing alkali metals contained in the glass substrate from diffusing into a semiconductor film which will be formed thereon. Thus, this film 101 can be omitted in the case of using quartz as the substrate.

For an amorphous semiconductor film 102 formed on the underlying insulating film 101, a semiconductor material made mainly of silicon is used. Typically, an amorphous silicon film, an amorphous silicon germanium film, or the like is used. The film 102 is formed by plasma CVD, reduced CVD or sputtering to have a thickness of 10–100 nm. In order to obtain high-quality crystal, the concentration of impurities, such as oxygen and nitrogen, contained in the amorphous semiconductor film 102 is preferably set to $5 \times 10^{18}/cm^3$ or less, and more preferably $1 \times 10^{18}/cm^3$ or less. Furthermore, in order to obtain a higher-quality crystalline semiconductor film, it is important that the concentration of oxygen in the amorphous semiconductor film 102 is $5 \times 10^{18}/cm^3$ or less, preferably $1 \times 10^{18}/cm^3$ or less. This is because if the concentration of oxygen in the amorphous semiconductor film is high, a catalyst element (particularly, nickel) which will be used in the next crystallizing step is not easily released. These impurities are factors of disturbing the crystallization of the amorphous semiconductor, and also of increasing the density of capture-centers or recombination-centers after the crystallization. It is therefore desired to use high-purity ingredient gases and further a CVD apparatus which has an oil-free evacuation system wherein a reaction chamber is subjected to mirror-plane treatment (electric field polishing treatment) and which can cope with ultrahigh vacuum.

Referring to FIGS. 1, a subsequent process from the step of crystallizing treatment using a catalyst element to the step of gettering the catalyst element will be described. After the formation of the amorphous semiconductor film, the catalyst element, which has the effect of promoting crystallization, is added to the surface of the amorphous silicon film 12 (102) (FIG. 1A). Examples of the catalyst element having the effect of promoting the crystallization of the semiconductor film include nickel (Ni), iron (Fe), cobalt (Co), ruthenium (Ru), rhodium (Rh), palladium (Pd), osmium (Os), iridium (Ir), platinum (Pt), copper (Cu), gold (Au) and aluminum (Al). One or more selected from these elements may be used. Nickel is typically used. A catalyst-containing layer 13 is formed by applying a nickel acetate solution containing 1–100 ppm by weight of nickel with a spinner (FIG. 1A). In order to make the wettability of the solution high in this case, the following surface-treatment step is performed: the step of forming a very thin oxidized film from an aqueous ozone-containing solution; etching the oxidized film with a mixed solution of hydrofluoric acid and hydrogen peroxide water to form a clean surface; and subsequently treating the surface again with an aqueous ozone-containing solution to form a very thin oxidized film. Since the surface of a semiconductor film such as a silicon film is originally hydrophobic, the above-mentioned formation of the oxidized film enables uniform coating of the nickel acetate solution.

Of course, the method of forming the catalyst-containing layer 13 is not limited to the above-mentioned method. The layer 13 may be formed by sputtering, vapor deposition, plasma treatment or the like. Before the formation of the amorphous silicon film 12, the catalyst-containing layer 13 may be formed on the underlying insulating film 11.

Heat treatment for crystallizing the amorphous semiconductor film is performed in the state that contact of the amorphous semiconductor film 12 with the catalyst-containing layer 13 is kept. The heat treatment is performed by means of the apparatus for heat treatment using an inert gas heated to a desired temperature, illustrated in FIGS. 14 and 15. However, the heat treatment apparatus is not limited to the apparatus illustrated in FIGS. 14 and 15.

By using the GRTA method to blow nitrogen heated to 650° C. against the substrate to be treated for 30 to 90 seconds, the heat treatment (first heat treatment) is performed to obtain a crystalline semiconductor film. In the heat treatment by the GRTA method, the substrate itself is not distorted or transformed. In this way, the amorphous semiconductor film is crystallized so that it can yield a crystalline semiconductor film 14 illustrated in FIG. 1B. The crystallization based on such a processing can never be attained if the catalyst element-containing layer is not formed.

The heat treatment for the crystallization may be performed in an inert gas by means of the heat sources set up in the heat treatment chamber of the apparatus illustrated in FIGS. 14 and 15. Examples of the heat sources include graphite (carbon) rods; graphite particles (kryptol); resistance heating elements made of a compound such as silicon carbide or lanthanum chromate, or a metal wire such as a platinum, Nichrome or tungsten wire; metal heating elements; ceramic heating elements; or platinum heating elements.

In order to make the crystallization rate (the rate of crystal components in the whole volume of the film) high and mend defects remaining in the crystal grains, it is effective to irradiate the crystalline semiconductor film 14 with a laser ray, as illustrated in FIG. 1C. As the laser ray, an excimer laser having a wavelength of 400 nm or less is used. In any case, a pulse laser having a repeating wavelength of about 10 to 1000 Hz is concentrated to have energy of 100 to 400 $mJ/cm^2$ through an optical system, and the laser is applied to the crystalline semiconductor film 104 at an overlap ratio of 90 to 95%.

In the thus-obtained crystalline semiconductor film 15, the catalyst element (nickel in the present example) remains. The catalyst element is not uniformly distributed in the film, and remains at an average concentration over $1 \times 10^{19}/cm^3$. Of course, in such a state various semiconductor elements such as TFTs can be formed. However, the catalyst element is removed by gettering comprising the following steps.

As illustrated in FIG. 1D, a thin layer 16 is firstly formed on the surface of the crystalline semiconductor film 15. In the specification, the thin layer 16 formed on the crystalline semiconductor film 15 is a layer formed in order that the first semiconductor film 15 will not be etched when a gettering site is removed afterwards, and is called the barrier layer 16.

The thickness of the barrier layer 16 is set to about 1 to 10 nm. Conveniently, a chemical oxide formed by treatment with ozone water may be formed as the barrier layer. In the same manner, the chemical oxide may be formed by treatment with an aqueous solution wherein sulfuric acid, hydrochloric acid, nitric acid or the like is mixed with hydrogen peroxide water. In a different way, ozone maybe generated by plasma treatment in an oxidizing atmosphere or irradiation with ultraviolet rays in an oxygen-containing atmosphere, so as to perform oxidizing treatment. A thin oxidized film as the barrier layer may be formed by heating the semiconductor film at about 200 to 350° C. in a clean oven. Alternatively, plasma CVD, sputtering, vapor deposition or the like may be used to form an oxidized film having a thickness of about 1 to 5 nm, as the barrier layer. In any case, it is advisable to use the following film: a film which enables the catalyst element to move to the side of the gettering site in a subsequent gettering step and which does not permit etching solution to be infiltrated (protection of the crystalline semiconductor film 15 from etching solution) in a subsequent step of removing the gettering site, for example, a chemical oxide film formed by treatment with ozone water, a silicon oxide film (SiOx) or a porous film.

Next, as the gettering site, a semiconductor film 17 is formed on the barrier layer 16 (FIG. 1D). As the gettering site 17, a semiconductor film (typically an amorphous silicon film) can be formed by sputtering besides plasma CVD. This film contains therein a rare gas element having a concentration of $1 \times 10^{20}/cm^3$ or more, preferably $2 \times 10^{20}/cm^3$ or more, and has a thickness of 20 to 250 nm. The semiconductor film 17 may contain oxygen at a concentration of $5 \times 10^{17}/cm^3$ or more (and $1 \times 10^{21}/cm^3$ or less). In a different method of forming the gettering site 17, a silicon film is formed and subsequently a rare gas element may be added thereto, so as to permit the formation of the gettering site 17. Since the gettering site 17 will be removed afterwards, the site 17 is preferably a film having a small density and an etching selection ratio largely different from the etching selection ratio of the crystalline semiconductor film 15.

Since the rare gas element itself is inactive in the semiconductor film, the rare gas element does not produce any bad effect on the crystalline semiconductor film 15. As the rare gas element, one or more selected from helium (He), neon (Ne), argon (Ar), krypton (Kr), and xenon (Xe) are used. The present example is characterized by forming the semiconductor film containing the rare gas element and oxygen and using this film as a gettering site.

Subsequently, by the GRTA method using, for example, an apparatus as illustrated in FIGS. 14 and 15, nitrogen heated to 610° C. is blown against the substrate to be treated for 1 to 10 minutes, in order to perform gettering surely. In this way, a heat treatment (second heat treatment) is performed to move the catalyst element in the crystalline silicon film to the gettering site (that is, perform gettering treatment).

The heat treatment for the gettering may be performed in an inert gas by means of the heat sources set up in the heat treatment chamber 1408 of the apparatus illustrated in FIGS. 14 and 15. Examples of the heat sources include graphite (carbon) rods; graphite particles (kryptol); resistance heating elements made of a compound such as silicon carbide or lanthanum chromate, or a metal wire such as a platinum, Nichrome or tungsten wire; metal heating elements; ceramic heating elements; or platinum heating elements.

In the gettering, the catalyst element present in the region which will undergo the gettering (capture site) is discharged by thermal energy, so that the catalyst element moves to the gettering site by diffusion. In the present invention, the distance along which the catalyst element moves at the time of the gettering is as long a distance as the thickness of the semiconductor film, as shown by arrows in FIG. 1C. Thus, in a relatively short time, the gettering can be accomplished. By performing such a gettering step, the concentration of the catalyst element present in channel-formed regions can be reduced and the off-state current of TFTs drops. Furthermore, a high electric field-effect mobility can be obtained since the semiconductor film has high crystallinity. Thus, a semiconductor device having good characteristics can be produced.

After the end of the gettering step, the gettering site 17 is selectively etched and removed. The method of the etching may be dry etching with $ClF_3$ without using plasma, or wet etching with an alkali solution such as an aqueous solution containing hydrazine or tetraethylammonium hydroxide (chemical formula: $(CH_3)_4NOH$). In this case, the barrier layer 16 functions as an etching stopper. The barrier layer 16 may be removed afterwards with hydrofluoric acid.

In this way, a crystalline semiconductor film 18 wherein the concentration of the catalyst element is reduced to $1 \times 10^{17}/cm^3$ or less can be obtained. The thus-formed crystalline semiconductor film 18 is made of crystal in a thin rod form or thin flat rod form on the basis of the effect of the catalyst element. The respective crystal grains thereof grow to have a specified orientation macroscopically.

Subsequently, in order to form a semiconductor layer including channel-formed regions, source regions and drain regions, the crystalline silicon film 18 is etched to form semiconductor layers 103 to 106. An impurity element for giving p-type conductivity may be added thereto in order to control the threshold value (Vth) of n-channel type TFTs. As the impurity element for giving p-type conductivity to a semiconductor, there is known a group XIII element in the periodic table, such as boron (B), aluminum (Al) or gallium (Ga).

Next, a gate insulating film 107 covering the semiconductor layers 103 to 106 separated into an island form is produced (FIGS. 3B and 4B). As the gate insulating film 107, an insulating film containing silicon is formed by plasma CVD or sputtering, so as to have a thickness of 40 to 150 nm. Of course, as this gate insulating film, an insulating film containing silicon and having a monolayer- or lamination-structure can be used.

In the case of using a silicon oxide film, the film can be formed by plasma CVD wherein TEOS (tetraethyl ortho silicate) and $O_2$ are mixed with each other and discharge is performed under the following conditions: reaction pressure: 40 Pa; substrate temperature: 300 to 400° C.; and high frequency wave (13.56 MHz) power density: 0.5 to 0.8 $W/cm^2$. The thus-formed silicon oxide film is subjected to thermal annealing at 400 to 500° C. after the formation thereof, so as to give good characteristics as a gate insulating film.

On the gate insulating film 107, the following are formed into a lamination: a first conductive film 108 having a film thickness of 20 to 100 nm; a second conductive film 109 having a film thickness of 100 to 400 nm; and a third conductive film having a film thickness of 20 to 100 nm (FIGS. 3C and 4C). In the present example, on the gate insulating film 107, a tungsten film having a film thickness of 50 nm, an alloy (Al—Ti) film made of aluminum and titanium and having a thickness of 500 nm, and a titanium film having a film thickness of 30 nm are successively deposited. The conductive material for making the gate electrodes is not limited to the above-mentioned materials and may be one or more elements selected from Ta, W, Ti, Mo, Al and Cu; or one or more alloy materials or compounds made mainly of one or more of these elements. As the first conductive layer contacting the insulating film, there may be used, for example, a film made mainly of TaN or W in order to prevent impurities from diffusing to the channel-formed regions. As the second conductive layer, there may be used a low-resistance material film made mainly of Al or Cu. As the third conductive film, there may be used a film having a low contact resistance and made mainly of Ti.

Alternatively, as the first conductive film, there may be used a semiconductor film, a typical example of which is a polycrystal silicon film doped with an impurity element such as phosphorus. The following combination may also be used: a combination of a tungsten (W) film as the first film, a Cu film as the second film and a titanium (Ti) film as the third film; a combination of a tantalum nitride (TaN) film as the first film, an aluminum (Al) film as the second film and a titanium (Ti) film as the third film; a combination of a tantalum nitride (TaN) film as the first film and an Al film as the second film; or a combination of a tantalum nitride (TaN) film as the first film, a Cu film as the second film and a titanium (Ti) film as the third film.

As illustrated in FIGS. 3B and 4B, next, a mask 110 made of a resist is formed in the step of photolithography, and then a first etching treatment is performed to form gate electrodes and interconnections. It is preferred to use, as the etching, ICP (inductively coupled plasma) etching. The etching gas which can be used may be a chlorine-based gas, the typical example of which is $Cl_2$, $BCl_3$, $SiCl_4$ or $CCl_4$, a fluorine-based gas, the typical example of which is $CF_4$, $SF_6$ or $NF_3$, or $O_2$, and is not limited. In the present example, $BCl_3$, $Cl_2$ and $O_2$ are suitably used. The gas flow rate thereof is set to 65/10/5 sccm. At a pressure of 1.2 Pa, an RF (13.56 MHz) electric power of 450 W is applied to a coil-shaped electrode to generate plasma. In this way, etching is performed for 117 seconds. An RF (13.56 MHz) electric power of 300 W is also applied to the side of the substrate (sample stage). In this way, a substantially negative self-biased voltage is applied thereto. Under the first etching conditions, the W film is etched to make the end of the first conductive layer into a tapered form.

Thereafter, the etching conditions are changed to second etching conditions. As etching gas, $CF_4$, $Cl_2$ and $O_2$ are used. The gas flow rate thereof is set to 25/25/10 sccm. At a pressure of 1 Pa, an RF (13.56 MHZ) of 500 W is applied to the coil-shaped electrode to generate plasma. In this way, etching is performed for about 30 seconds. An RF (13.56 MHz) electric power of 20 W is also applied to the side of the substrate (sample stage). In this way, a substantially negative self-biased voltage is applied thereto. Under the second etching conditions in which $CF_4$ and $Cl_2$ are mixed, the W film and the TaN film are etched to substantially the same degree. In order to etch these films without residues remaining on the gate insulating film, it is preferred to increase the etching time by 10 to 20%.

In the first etching treatment, by making the shape of the mask made of the resist appropriate, the ends of the first conductive layer and the second conductive layers are made into a tapered form by the effect of the bias voltage applied to the substrate side. The angle of this tapered portion is from 15 to 45°. By the first etching treatment in this way, first-shape conductive layers 112 to 115 made of the first and second conductive layers (first conductive layers 112a to 1152a, second conductive layers 112b to 115b, and third conductive layers 112c to 115c) (FIGS. 3D and 4D). The region of the gate insulating film not covered with the first-shape conductive layers 112 to 115 is etched by about 20 to 50 nm, and becomes thin.

Next, a second etching treatment is performed without removing the mask 111 made of the resist. As etching gas, $BCl_3$ and $Cl_2$ are used. The gas flow rate thereof is set to 20/60 sccm. At a pressure of 1.2 Pa, an RF (13.56 MHz) of 600 W is applied to the coil-shaped electrode to generate plasma. In this way, etching is performed. An RF (13.56 MHz) electric power of 100 W is also applied to the side of the substrate (sample stage). Under the third etching conditions, the second conductive layer is etched. Under the above-mentioned third etching conditions, the aluminum film containing a very small of titanium is anisotropically etched to form second-shape conductive layers 116 to 119 (first conductive layers 116a to 119a, second conductive layers 116b to 119b, and third conductive layers 116c to 119c) (FIG. 7B). The region of the gate insulating film not covered with the second-shape conductive layers 116 to 119 is slightly etched, and becomes thin.

A first doping treatment is performed without removing the mask made of the resist to add an impurity element for giving n-type conductivity to the semiconductor layer. The doping treatment may be performed by ion doping or ion implanting. Conditions for the ion doping are as follows: dose: $1.5 \times 10^{14}$ atoms/cm$^2$; and accelerating voltage: 60 to 100 kV. As the impurity element for giving n-type conductivity, an element belonging to the group XV in the periodic table is used. The typical example thereof is phosphorus (P) or arsenic (As). In this case, the second-shape conductive layers 116 to 119 are used as a mask for the impurity element for giving n-type conductivity. First impurity regions 120 to 123 are formed in self-alignment. To the first impurity regions 120 to 123 is added the impurity element for giving n-type conductivity at a concentration of $1 \times 10^{16}$ to $1 \times 10^{17}$/cm$^3$ (FIGS. 3E and 4E).

Next, a mask 124 made of a resist is formed to perform a second doping treatment, as illustrated in FIGS. 5A and 6A. The mask 124 is a mask for protecting channel-formed regions of the semiconductor layer which makes p-channel type TFTs of a driving circuit, and the peripheral regions thereof (mask which permits the n-type impurity element to be added in some parts of the semiconductor layer 102).

Conditions for ion doping in the second doping treatment are as follows: dose: $1.5 \times 10^{15}$ atoms/cm$^2$; and accelerating voltage: 60 to 100 kV. Under the conditions, doping with phosphorus (P) is performed. In the present example, difference in film thickness between the second-shape conductive layers 116 to 119 and the gate insulating film is used to form impurity regions in the respective semiconductor layers. Phosphorus (P) is not added to the regions covered with the mask 124. In this way, second impurity regions 125 and 126a to 128a and third impurity regions 126b to 128b are formed. To the second impurity regions 125 to 128 is added an impurity for giving n-type conductivity at a concentration of $1 \times 10^{20}$ to $1 \times 10^{21}$/cm$^3$. The third impurity regions are formed to have a lower impurity concentration than the third impurity region on the basis of the film thickness difference in the gate insulating film. To the third impurity regions is added an impurity for giving n-type conductivity at a concentration of $1 \times 10^{18}$ to $1 \times 10^{19}$/cm$^3$.

Next, masks 129 and 130 made of a resist are newly formed and then a third doping treatment is performed, as illustrated in FIGS. 5B and 6B. By the third doping treatment, fourth impurity regions 131, 132 and 134 and fifth impurity regions 133 and 135 are formed wherein an impurity for giving p-type conductivity is added to the semiconductor layer which makes p-channel type TFTs. To the fourth impurity regions 131, 132 and 134 is added the impurity for giving p-type conductivity at a concentration of $1 \times 10^{20}$ to $1 \times 10^{21}$/cm$^3$. The fourth impurity regions are regions formed so as to overlap with the second-shape conductive layers. To these regions is added the impurity for giving p-type conductivity at a concentration of $1 \times 10^{18}$ to $1 \times 10^{20}$/cm$^3$. The fourth impurity region 131 is a region to which phosphorus (P) is added in the previous step.

The impurity regions 134 and 135 are formed in the semiconductor layer which makes retention capacitances in a pixel section.

By the steps described above, the impurity regions having n-type or p-type conductivity are formed in the respective semiconductor layers. The second-shape conductive layers 116 to 119 become gate electrodes. The second shape conductive layer 119 becomes one of electrodes which make the retention capacitance in the pixel section.

Next, a first interlayer dielectric 136a which covers the substantially entire surface is formed (FIG. 5C and FIG. 6C). The first interlayer dielectric 136a is formed as an insulating film containing silicon and hydrogen by plasma CVD or sputtering, to have a thickness of 100 to 200 nm. A preferred example thereof is an oxynitride silicon film formed by plasma CVD and having a thickness of 150 nm. Of course, the first interlayer dielectric is not limited to the oxynitride silicon film, and may be a different insulating film containing silicon and having a monolayer structure or lamination structure.

Thereafter, the step of activating the impurity elements added to the respective layers is performed. In this activation step, a second harmonic wave (532 nm) of a YAG layer is used and this laser ray is applied to the semiconductor films. A similar operation is performed in RTA method using a lamp light source as well as the laser ray. The semiconductor films are heated from both sides of the substrate or the substrate side by radiation of the lamp light source.

Thereafter, an insulating film 136b made of silicon nitride is formed by plasma CVD to have a thickness of 50 to 100 nm. A clean oven is used to perform heat treatment at 410° C., thereby hydrogenating the semiconductor films with hydrogen released from the nitride silicon film.

Next, a third interlayer dielectric 137 made of an organic insulator material is formed on the second interlayer dielectric 136b. Next, contact holes reaching the respective impurity regions are made. Thereafter, Al, Ti, Mo, W or the like is used to form interconnections and pixel electrodes. For example, a lamination film composed of a Ti film having a thickness of 50 to 250 nm and an alloy film (made of Al and Ti) having a thickness of 300 to 500 nm is used. In this way, interconnections 138 to 144 and a pixel electrode 145 are formed (FIGS. 5D and 6D).

In such a way as above, a driving circuit 305 having a p-channel type TFT 301 and an n-channel type TFT 302 and a pixel section 306 having an n-channel type TFT 303 and a retention capacitance 304 are formed on the same substrate. In the present specification, such a substrate is conveniently called an active matrix substrate. The TFT of the pixel section 306 may be a p-channel type TFT.

The p-channel type TFT 301 of the driving circuit 305 comprises a channel formed region 310, the impurity region 133 which overlaps partially with the second-shape conductive layer 116 which makes a gate electrode, and the impurity region 132 which functions as a source or drain region. The n-channel type TFT 302 comprises a channel formed region 311, the impurity region 126b which overlaps partially with the second-shape conductive layer 117 which makes a gate electrode, and the impurity region 126a which functions as a source or drain region. Such n-channel type and p-channel type TFTs can make a shift register circuit, a buffer circuit, a level shifter circuit, a latch circuit or the like. The construction of the n-channel type TFT 302 is particularly suitable for a buffer circuit wherein a high driving voltage is required, in order to prevent deterioration based on hot carrier effect.

The pixel TFT 303 of the pixel section 305 comprises a channel formed region 312, the impurity region 127b which overlaps partially with the second-shape conductive layer 118 which makes a gate electrode, and the impurity region 127a which functions as a source and drain region. In the semiconductor layer which functions as one of electrodes of the retention capacitance 304, the impurity regions 134 and 135 to which the p-type impurity is added are formed. The retention capacitance 304 is composed of the insulating film (equal to the gate insulating film) as a dielectric, the second-shape electrode 119 and the semiconductor layer 106.

The present invention enables optimization of the construction of a TFT which makes each circuit in accordance with the circuit specification which a pixel section and a driving circuit require and to improve operation performance and reliability of a semiconductor device. Specifically, an n-channel type TFT is caused to have an LDD construction varied in accordance with the circuit specification. As described above, the n-channel type TFT of the driving circuit is made up to an LDD construction overlapping partially with the gate electrode to prevent deterioration of the TFT based on hot carrier effect. The n-channel type TFT of the pixel section is made up to an LDD construction not overlapping with the gate electrode. In this construction, importance is attached to a reduction in off-state current. The present example provides a technique of forming n-channel type TFTs having such different structures and p-channel type TFTs on the same substrate. The formation can be attained with six photo masks. If its pixel electrodes are made of a transparent conductive film, the number of the photo masks to be used increases by one; however, a transmission-type display device can be formed.

Example 2

In the present example, the present invention is applied to the step of manufacturing bottom gate type TFTs. Referring to FIGS. 8 and 9, the step of manufacturing the bottom gate TFTs will be briefly described.

An insulating film such as a silicon oxide film, a silicon nitride film or a silicon oxynitride film, which is not illustrated, is formed on a substrate 50. A conductive film is formed to constitute gate electrodes, and patterned into a desired form, to yield gate electrodes 51. The conductive film may be a conductive film made of an element selected from Ta, Ti, W, Mo, Cr and Al, or made mainly of an element selected from the same group (FIG. 8A).

Next, agate insulating film 52 is formed. The gate insulating film may be a single layer selected from a silicon oxide film, a silicon nitride film and a silicon oxynitride film; or may be a lamination-structure film composed of two or more layers selected from the same group (FIG. 8B).

Next, an amorphous silicon film 53 is formed as an amorphous semiconductor film by thermal CVD, plasma CVD, reduced-pressure CVD, vapor deposition or sputtering, to have a thickness of 10 to 1150 nm. Since the gate insulating film 52 and the amorphous silicon film 53 can be formed by the same method, the two may be continuously formed. The continuous formation does not cause the workpiece to be exposed to the air, so that pollution of the surface thereof can be prevented and a scattering or variation in the characteristics or the threshold voltage of TFTs to be manufactured (FIG. 8C).

Next, a catalyst element for prompting crystallization is applied to the amorphous silicon film 53, so as to form a catalyst element containing layer 54. Subsequently, for example, an apparatus as shown in FIGS. 14 and 15 is used to perform a heat treatment according to the GRTA method as described in Example 1, thereby forming a crystalline silicon film 55. The heat treatment for the crystallization (first heat treatment) may be performed in an inert gas by means of the heat sources set up in the heat treatment chamber 1408 of the apparatus illustrated in FIGS. 14 and 15. The heat sources may be graphite (carbon) rods; graphite particles (kryptol); resistance heating elements made of a compound such as silicon carbide or lanthanum chromate, or a metal wire such as a platinum, Nichrome or tungsten wire; metal heating elements; ceramic heating elements; or platinum heating elements.

After the end of the crystallization step, a barrier layer 56 is formed on the crystalline silicon film 55. The barrier layer 56 may be a film as described in Embodiment 1. In the present example, the following film is formed: a porous film which enables that the catalyst (nickel) penetrates through a gettering site and which does not permit the infiltration of an etching solution used in the subsequent step of removing the gettering site into the film itself; or a chemical oxide film formed by treatment with ozone water (FIG. 8D).

Next, a semiconductor film 57 containing a rare gas element is formed as a gettering site. In the present example, the flow rate of Ar, the pressure for forming the film, electric power and substrate temperature were 50 sccm, 0.2 Pa, 3 kW and 150° C., respectively. The formed semiconductor film 57 contains the rare gas element at a concentration $1 \times 10^{19}$ to $1 \times 10^{22}/cm^3$, preferably $1 \times 10^{\circ}$ to $1 \times 10^{21}/cm^3$, and more preferably $5 \times 10^{20}/cm^3$, and oxygen at a concentration of $5 \times 10^{18}$ to $1 \times 10^{21}/cm^3$.

Next, a heat treatment (second heat treatment) for moving the catalyst element from the crystalline semiconductor film 55 to the gettering site 57 (gettering of the catalyst) is performed. It is advisable that as the heat treatment, performed is a heat treatment according to the method using, for example, an apparatus as shown in FIGS. 14 and 15 in the same way as in the above-mentioned crystallization step. This heat treatment enables reduction in the catalyst element concentration in the crystalline semiconductor film 55 to $1 \times 10^{17}/cm^3$ or less. The heat treatment for the gettering may be performed in an inert gas by means of the heat sources set up in the heat treatment chamber 1408 of the apparatus illustrated in FIGS. 14 and 15. The heat sources may be graphite (carbon) rods; graphite particles (kryptol); resistance heating elements made of a compound such as silicon carbide or lanthanum chromate, or a metal wire such as a platinum, Nichrome or tungsten wire; metal heating elements; ceramic heating elements; or platinum heating elements.

After the end of the gettering step, the gettering site 57 and the barrier layer 56 are removed.

Next, a mask 58 made of an insulating film is formed in order that no impurity elements will be added to regions which will be channel-formed regions afterwards in a subsequent impurity-adding step. This insulating film may be made of silicon oxide. Subsequently, an insulating film 59 for protecting the crystalline silicon film and controlling the concentration of the impurity elements to be added is formed to have a thickness of 100 to 400 nm. This insulating film has functions of causing the crystalline silicon film not to be exposed directly to plasma when the impurity elements are added, and of enabling subtle control of the concentrations thereof.

Next, masks made of a resist are used to add an impurity element for giving n-type conductivity to the crystalline silicon film which will be an active layer of n-channel type TFTs afterwards, and add a p-type impurity element to the crystalline silicon film which will be an active layer of p-channel type TFTs afterwards. In this way, source regions, drain regions and LDD regions are formed. In the case that the impurity element for giving n-type conductivity is added, the regions which will be the p-channel type TFTs afterwards are covered with the mask and then the impurity element is added. On the other hand, in the case that the impurity element for giving p-type conductivity is added, the regions which will be the n-channel type TFTs afterwards by the addition of the impurity element for giving n-type conductivity are covered with the mask and then the impurity element is added.

Next, the step of activating the impurity elements added to the crystalline silicon film is performed (FIG. 9A). Subsequently, the mask 58 and the insulating film 59 on the crystalline silicon film are removed and the crystalline silicon film is patterned into a desired form. Thereafter, an interlayer dielectric 60 is formed. The interlayer dielectric is formed as an insulating film, such a silicon oxide film, silicon nitride film or silicon oxynitride film, having a thickness of 500 to 1500 nm (FIG. 9B).

Thereafter, contact holes reaching the source regions and the drain regions of the respective TFTs are made, and then interconnections 61–66 for connecting the TFTs to each other are formed.

By the utilization of the present invention as described above, the following can be formed on the same substrate: n-channel type TFTs 80 (each of which has the gate electrode 51, the gate insulating film 52, the channel-formed region 69, the source or drain region 67, and the interconnections 61–63), and p-channel type TFTs 81 (each of which has the gate electrode 51, the gate insulating film 52, the channel-formed region 71, the source or drain region 70, and the interconnections 64–66). As described herein, the present invention can be applied to TFTs regardless of the shape thereof.

Example 3

Referring to FIGS. 17 and 18, a further example from the crystallization step to the gettering step, using the GRTA method, will be described.

The material of a substrate 1700 is not particularly limited, and is preferably barium borosilicate glass, alumino borosilicate glass, quartz or the like. An inorganic insulating film is formed as an underlying all insulating film 1701 on the surface of the substrate 1700, so as to have a thickness of 10 to 200 nm. A preferred example of the underlying insulating film is a silicon oxynitride film produced by plasma CVD. As this film, there is used a film composed of a first silicon oxynitride film 1701a made from $SiH_4$, $NH_3$ and $N_2O$ and having a thickness of 50 nm and a second silicon oxynitride film 1701b made from $SiH_4$ and $N_2O$ and having a thickness of 100 nm.

An amorphous semiconductor film 1702 made mainly of silicon is formed on the underlying insulating film 1701. Typically, an amorphous silicon film, an amorphous silicon germanium film or the like is used. The film is formed by plasma CVD, reduced-pressure CVD or sputtering, to have a thickness of 10 to 100 nm (FIG. 17A).

After the amorphous semiconductor film 1702 is formed, a metal element having a catalyst effect of promoting the crystallization of the semiconductor film is added to the surface of the amorphous semiconductor film 1702. The metal element having the catalyst effect of promoting the crystallization of the semiconductor film may be one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al). Typically, nickel is used. A catalyst-containing layer 1703 is formed by applying a nickel acetate solution containing 1–100 ppm by weight of nickel with a spinner (FIG. 17B). The method of forming the catalyst-containing layer 1703 is not limited to such a method. The film 1703 may be formed by sputtering, vapor deposition, plasma treatment or the like. The catalyst-containing layer 1703 may be formed on the underlying insulating film 1701 before the formation of the amorphous semiconductor film 1702.

In the state that the contact of the amorphous semiconductor film 1702 with the catalyst element containing layer 1703 is kept, a heat treatment for crystallization (first heat treatment) is performed. In the manner of the heating element treatment, heating with a gas heated to a desired temperature may be performed, using, for example, an apparatus shown in FIGS. 14 and 15. The heating treatment for the crystallization may be performed in an inert gas by means of the heat sources set up in the heat treatment chamber 1408 of the apparatus illustrated in FIGS. 14 and 15. The heat sources may be graphite (carbon) rods; graphite particles (kryptol); resistance heating elements made of a compound such as silicon carbide or lanthanum chromate, or a metal wire such as a platinum, Nichrome or tungsten wire; metal heating elements; ceramic heating elements; or platinum heating elements.

Using the GRTA method, the heating element treatment is performed by blowing nitrogen heated to 650° C. against the substrate to be treated for 30 to 90 seconds, so as to yield a crystalline semiconductor film 1704. In the heat treatment according to the GRTA method, the substrate 1700 itself neither distorts nor deforms. In this way, the amorphous semiconductor film is crystallized so that the crystalline semiconductor film 1704 can be yielded.

Next, irradiation with a laser may be performed to make the crystallinity of the crystalline semiconductor film 1704 high (FIG. 17C).

Subsequently, the crystalline semiconductor film is etched to form layers (i.e., semiconductor layers including channel-formed regions, source regions and drain regions) 1705 and 1706 which will be active layers of TFTs afterwards. Thereafter, a gate insulating film 1707 is formed to cover the semiconductor film 1705 and 1706 (FIG. 17D). As this time, an impurity element for giving p-type conductivity maybe added thereto, in order to control the threshold value (Vth) of the TFTs of an n-channel type. As the impurity element for giving p-type conductivity to a semiconductor, there are known group XIII elements in the periodic table, such as boron (B), aluminum (Al) and gallium (Ga).

Subsequently, a conductive film is formed on the gate insulating film to form gate electrodes. Masks 1708 and 1709 made of a resist are formed to etch the conductive film into a given form, and first-shape gate electrodes 1710 and 1711 are formed (FIG. 17E). The gate electrodes illustrated in FIGS. 17 have a monolayer structure. However, the structure of the gate electrodes may be appropriately decided. Thus, the electrodes may have a multi-layered structure wherein two or more layers are stacked, each of which is made of an element selected from Ta, W, Ti, Mo, Al and Cu, or an alloy or a compound made mainly of the element selected from the same group. Next, the first-shape gate electrodes 1710 and 1711 are used as masks to add an n-type impurity element thereto. In this way, n-type impurity regions 1712 and 1713 are formed.

Next, the first-shape gate electrodes 1710 and 1711 are further etched to form second-shape gate electrodes 1714 and 1715.

Subsequently, such a mask 1716 that an impurity element can be added to some portions of the semiconductor layer which will be the active layer of the TFTs of a p-channel type afterwards is formed, and then an n-type impurity element is added thereto, so as to form n-type impurity regions 1717, 1718 and 1719. The n-type impurity element is added at a concentration of $1 \times 10^{20}$ to $1 \times 10^{21}/cm^3$ to the n-type impurity regions 1717 and 1718. Since the impurity element is added through the gate electrodes to the n-type impurity region 1719, to the region 1719 is added the n-type impurity element at a concentration of $1 \times 10^{18}$ to $1 \times 10^{19}/cm^3$, which is lower than the concentration in the n-type impurity regions 1717 and 1718 (FIG. 18A).

Next, a mask 1720 covering the semiconductor layer which will be the active layer of the TFTs of an n-channel type afterwards is formed, and then a p-type impurity element is added thereto, so as to form p-type impurity regions 1721, 1722 and 1723. The p-type impurity region 1721 contains the n-type impurity element at a concentration of $1 \times 10^{20}$ to $1 \times 10^{21}/cm^3$ and the p-type impurity element at a concentration of $1 \times 10^{20}$ to $1 \times 10^{21}/cm^3$. The p-type impurity region 1722 contains the p-type impurity element at a concentration of $1 \times 10^{20}$ to $1 \times 10^{21}/cm^3$. The p-type impurity region 1723 contains the p-type impurity element at a concentration of $1 \times 10^{18}$ to $1 \times 10^{20}/cm^3$ (FIG. 18B).

Thereafter, a first interlayer dielectric 1724 is formed. The first interlayer dielectric 1724 is formed as an insulating film made from silicon and hydrogen by plasma CVD or sputtering and having a thickness of 100 to 200 nm.

Thereafter, the step of subjecting the impurity elements added to the respective semiconductor layers to activating treatment is performed. The activation is performed by a heat treatment according to the GRTA method (second heat treatment) or irradiation of the semiconductor films with a second harmonic wave (532 nm) of a YAG laser. At this time, the catalyst elements remaining in the semiconductor layers are shifted to the regions 1718 and 1721 containing the n-type impurity element having gettering effect at the high concentration, so that gettering can be performed.

In this way, it is allowable to form the gettering site containing the rare gas element, as performed in Embodiments 1 and 2 and Example 1, after the crystallization step of the amorphous semiconductor film, and then carry out the gettering step according to the GRTA method. However, at the same time of the heat treatment for activating the impurity elements which are added to the semiconductor layer in the steps other than the gettering step, the gettering of the catalyst element can be performed. By adding a rare gas element (one or more selected from Ar, He, Ne, Kr and Xe) or carbon to the regions 1718 and 1721 containing the n-type impurity at the high concentration, the efficiency of the gettering would be made higher.

Thereafter, an insulating film (not illustrated) made of silicon nitride is formed by plasma CVD to have a thickness of 50 to 100 nm, and then a clean oven is used to perform a heat treatment at 410° C. In this way, the semiconductor film is hydrogenated with hydrogen released from the silicon nitride film (FIG. 18C).

Next, a second interlayer dielectric 1725 made of an organic insulating material is formed on the first interlayer dielectric 1724. Next, contact holes reaching the respective impurity regions are made. Thereafter, Al, Ti, Mo, W or the like is used to form interconnections and pixel electrodes. For example, there is used a lamination film composed of a Ti film having a thickness of 50 to 250 nm, and an alloy film (alloy made of Al and Ti) having a thickness of 300 to 500 nm. In this way, interconnections 1726 to 1729 are formed so that a p-channel type TFT 1730 and an n-channel type TFT 1731 can be manufactured (FIG. 18D).

Using the GRTA method, such a process for manufacturing a semiconductor device as described above can be carried out. The present example can be combined with Embodiment 1, 2 or 3, or Example 1 or 2.

Example 4

FIG. 10 shows an example of a configuration of an active matrix driving type light-emitting device. An n-channel TFT 652 and a p-channel TFT 653 of a driving circuit portion 650, and a switching TFT 654 and a current control TFT 655 of a pixel portion 651 shown in FIG. 10 are manufactured in the same way as in Embodiment 1 according to the present invention.

A first interlayer insulating film 618 made of silicon nitride and silicon oxynitride is formed on the upper surface of gate electrodes 608 to 611, and used as a protecting film. Furthermore, a second interlayer insulating film 619 made of an organic resin material such as polyimide or acrylic resin is formed as a flattening film.

The circuit configuration of the driving circuit portion 650 is varied between a gate signal side driving circuit and a data signal side driving circuit; however, the description thereof will be omitted here. Wirings 612 and 613 are connected to an n-channel TFT 652 and ap-channel TFT 653, and a shift register, a latch circuit, and a buffer circuit are formed using these TFTs.

In the pixel portion 651, a data wiring 614 is connected to a source side of the switching TFT 654, and a wiring 615 on the drain side is connected to a gate electrode 611 of the current control TFT 655. Furthermore, a source side of the current control TFT 655 is connected to a power source supply wiring 617, and an electrode 616 on the drain side is connected to an anode of a light-emitting element.

On the above-mentioned wirings, a second interlayer insulating film 627 made of an organic insulating material such as silicon nitride is formed. The organic resin material occludes $H_2O$ due to its hygroscopicity. When $H_2O$ thereof is released again, $H_2O$ supplies oxygen to an organic compound to degrade an organic light-emitting element. Therefore, in order to prevent occlusion and release of $H_2O$, a third insulating film 620 made of silicon nitride or silicon oxynitride is formed on the second interlayer insulating film 627. Alternatively, it may also be possible that the second interlayer insulating film 627 is omitted, and only the third insulating film 620 is formed.

An organic light-emitting element 656 is formed on the third insulating film 620, and is composed of an anode 621 made of a transparent conductive material such as ITO (indium tin oxide), an organic compound layer 623 having a hole injection layer, a hole transport layer, a light-emitting layer, and the like, and a cathode 624 made of alkali metal such as MgAg or LiF or alkaline-earth metal. The configuration of the organic compound layer 623 may be arbitrarily determined.

A bank 622 made of a photosensitive resin material is provided on the third insulating film 620. The bank 622 is formed so as to cover the ends of the anode 622. More specifically, the bank 622 is formed by coating of a negative resist, followed by baking so as to have a thickness of about 1 to 2 μm. Thereafter, the negative resist is exposed to light by irradiation with UV-rays using a photomask with a predetermined pattern.

A material containing magnesium (Mg), lithium (Li), or calcium (Ca) having a small work function is used for the cathode 624. Preferably, an electrode made of MgAg (material obtained by mixing Mg with Ag at a ratio of 10:1) may be used. Alternatively, an MgAgAl electrode, a LiAl electrode, or a LiFAl electrode can be used. On the cathode 624, a fourth insulating film 625 is formed of silicon nitride or a DLC film to a thickness of 2 to 30 nm, preferably 5 to 10 nm. The DLC film can be formed by plasma CVD. Even when the DLC film is formed at 100° C. or lower, the DLC film can be formed so as to cover the ends of the bank 622 with good coverage. The internal stress of the DLC film can be alleviated by mixing a small amount of oxygen or nitrogen, and the DLC film can be used as a protective film. It is known that the DLC film has a high gas barrier property with respect to oxygen, CO, $CO_2$, $H_2O$, and the like. It is desired that the fourth insulating film 625 be formed continuously after formation of the cathode 624 without being exposed to the atmosphere. This is because the state of the interface between the cathode 624 and the organic compound layer 623 largely influences a light-emitting efficiency of an organic light-emitting element.

In FIG. 10, the switching TFT 654 has a multi-gate structure, and in the current control TFT 655, an LDD is provided so as to be overlapped with a gate electrode. A TFT using polycrystalline silicon exhibits a high operation speed, so that degradation of injection of hot carriers and the like is likely to occur. Therefore, as shown in FIG. 6, it is very effective for manufacturing a highly reliable display device capable of displaying a satisfactory image (having high operation performance) to form TFTs (i.e., a switching TFT having a sufficiently low off-current and a current control TFT resistant to injection of hot carriers) having different structures in accordance with a function in a pixel.

As shown in FIG. 10, a first insulating film 602 is formed under (on the substrate 601 side of) the semiconductor film in which TFTs 654 and 655 are formed. A second interlayer insulating film 618 is formed above the semiconductor film. On the other hand, a third insulating film 620 is formed under the organic light-emitting element 656. A fourth insulating film 625 is formed above the organic light-emitting element 656. It is considered that alkali metal such as sodium to which the TFTs 654 and 655 are weakest is generated from the substrate 601 and the organic light-emitting element 656. The alkali metal is blocked by surrounding the TFTs 654 and 655 with the first insulating film 602 and the second interlayer insulating film 618. The organic light-emitting element 656 is weakest to oxygen and $H_2O$, so that the third insulating film 620 and the fourth insulating film 625 are formed so as to block them. The third and fourth insulating films 620 and 625 have a function of preventing alkali metal elements of the organic light-emitting element 656 from being released therefrom.

As an example of an effective method of manufacturing an organic light-emitting device with a structure as shown in FIG. 10, a process may be adopted in which the third insulating film 620 and the anode 621 made of a transparent conductive film such as ITO are continuously formed by sputtering. In order to form a refined silicon nitride film or silicon oxynitride film without remarkably damaging the surface of the organic insulating film 619, sputtering is suitable.

As described above, a pixel portion is formed by combining TFTs and the organic light-emitting device, whereby the light-emitting device can be completed. In such a light-emitting device, a driving circuit can also be formed on the same substrate, using a TFT. By surrounding the lower layer side and upper layer side of the semiconductor film, the gate insulating film, and the gate electrode that are main constituent elements of a TFT by a blocking layer made of silicon nitride or silicon oxynitride and a protective film, contamination with alkali metal and an organic substance can be prevented. On the other hand, the organic light-emitting element contains alkali metal in a part thereof, and is surrounded by a protective film made of silicon nitride or silicon oxynitride and a gas barrier layer made of an insulating film containing silicon nitride or carbon as its main component, whereby oxygen and $H_2O$ are prevented from entering from outside.

As described above, according to the present invention, the light emitting device can be completed by combining elements with different characteristics to the impurities without the mutual interference of the elements. Further, the influence due to the stress is eliminated to improve the reliability.

Example 5

The CMOS circuit and the pixel portion formed by implementing the present invention can be used in active matrix type display, (liquid crystal display device). That is, the present invention can be implemented in all of electronic apparatus integrated with the liquid crystal display device at display portions thereof.

As such electronic apparatus, there are pointed out a video camera, a digital camera, a projector (rear type or front type), a head mount display (goggle type display), a personal computer, a portable information terminal (mobile computer, portable telephone or electronic book) and the like. Examples of these are shown in FIGS. 11, 12 and 13.

FIG. 11A shows a personal computer including a main body 2001, an image input portion 2002, a display portion 2003 and a keyboard 2004.

FIG. 11B shows a video camera including a main body 2101, a display portion 2102, a voice input portion 2103, operation switches 2104, a battery 2105 and an image receiving portion 2106.

FIG. 11C shows a mobile computer including a main body 2201, a camera portion 2202, an image receiving portion 2203, an operation switch 2204 and a display portion 2205.

FIG. 11D shows a goggle type display including a main body 2301, a display portion 2302 and an arm portion 2303.

FIG. 11E shows a player using a record medium recorded with programs (hereinafter, referred to as record medium) including a main body 2401, a display portion 2402, a speaker portion 2403, a record medium 2404 and an operation switch 2405. The player uses DVD (Digital Versatile Disc) or CD as the record medium and can enjoy music, enjoy movie and carry out game or Internet.

FIG. 11F shows a digital camera including a main body 2501, a display portion 2502, an eye contact portion 2503, operation switches 2504 and an image receiving portion (not illustrated).

FIG. 12A shows a front type projector including a projection apparatus 2601 and a screen 2602.

FIG. 12B shows a rear type projector including a main body 2701, a projection apparatus 2702, a mirror 2703 and a screen 2704.

Further, FIG. 12C is a view showing an example of a structure of the projection apparatus 2601 and 2702 in FIG. 12A and FIG. 12B. The projection apparatus 2601 or 2702 is constituted by a light source optical system 2801, mirrors 2802, and 2804 through 2806, a dichroic mirror 2803, a prism 2807, a liquid crystal display apparatus 2808, a phase difference plate 2809 and a projection optical system 2810. The projection optical system 2810 is constituted by an optical system including a projection lens. Although the embodiment shows an example of three plates type, the embodiment is not particularly limited thereto but may be of, for example, a single plate type. Further, person of executing the embodiment may pertinently provide an optical system such as an optical lens, a film having a polarization function, a film for adjusting a phase difference or an IR film in an optical path shown by arrow marks in FIG. 12C.

Further, FIG. 12D is a view showing an example of a structure of the light source optical system 2801 in FIG. 12C. According to the embodiment, the light source optical system 2801 is constituted by a reflector 2811, a light source 2812, lens arrays 2813 and 2814, a polarization conversion element 2815 and a focusing lens 2816. Further, the light source optical system shown in FIG. 12D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIG. 12, there is shown a case of using a transmission type electrooptic apparatus and an example of applying a reflection type liquid crystal display device is not illustrated.

Figure 13A:
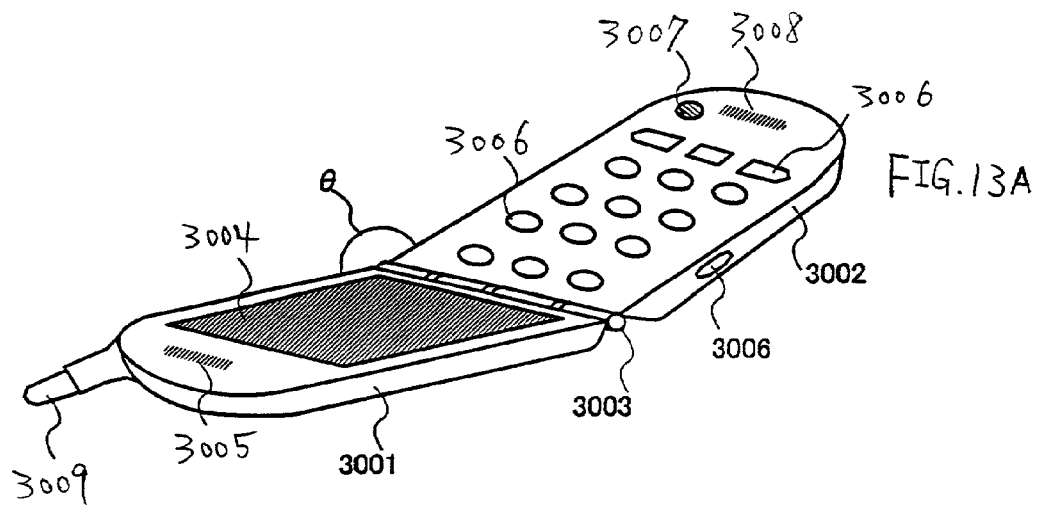
FIGS. 13A to 13C are views illustrating electrical equipments using, as a display section, a liquid crystal display device manufactured by the present invention.

FIG. 13A shows a portable telephone including a display pane 3001, an operation panel 3002. The display panel 3001 and the operation panel 3002 are connected to each other in the connecting portion 3003. In the connecting panel 3003, the angle θ of a face which is provided the display portion 3004 of the display panel 3001 and a face which is provided the operation key 3006 of the operation panel 3002 can be changed arbitrary. Further, a voice output portion 3005, an operation key 3006, a power source switch 3007 and a sound input portion 3008 are also included.

Figure 13B:
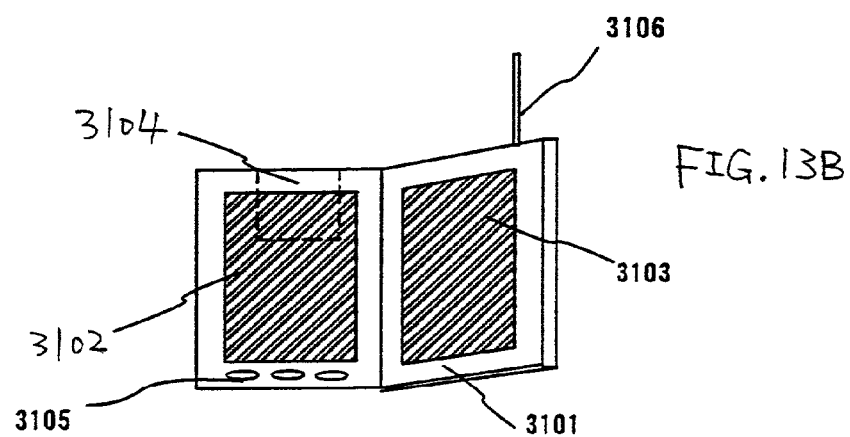

FIG. 13B shows a portable book (electronic book) including a main body 3101, display portion 3102, 3103, a record medium 3104, an operation switch 3105 and an antenna 3106.

Figure 13C:
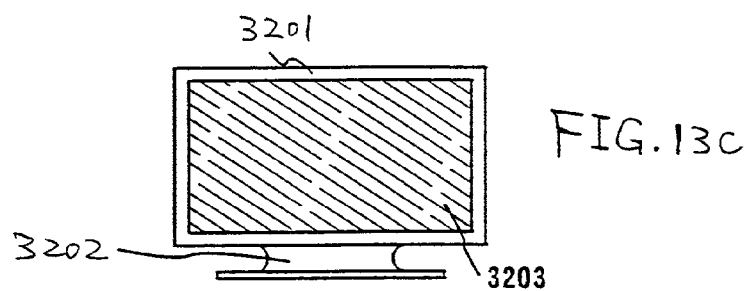

FIG. 13C shows a display including a main body 3201, a support base 3202 and a display portion 3203.

As has been described, the range of applying the invention is extremely wide and is applicable to electronic apparatus of all the fields. The electronic apparatus of this embodiment can be implemented by freely combined with Embodiment modes 1 to 4, Embodiments 1, and 2.

According to the present invention, crystallization treatment of a semiconductor film can be performed at low temperature in a short time, using a catalyst element for promoting crystallization. Thus, the catalyst element can be effectively removed from the semiconductor film, or the concentration thereof can be reduced. Since a rare gas element used for gettering is inactive in the semiconductor film, bad effects, such as a variation in the threshold voltage of TFTs, are not produced.

Furthermore, by using the semiconductor film wherein the concentration of the catalyst element is sufficiently reduced as an active layer, characteristics of the TFTs are improved. Characteristics of semiconductor devices or liquid display devices manufactured using these TFTs can also be improved.

What is claimed is:

1. A process for manufacturing a semiconductor device, comprising the steps of:
    forming a first amorphous semiconductor film over an insulating surface,
    providing the first amorphous semiconductor film with a catalyst element for promoting crystallization, and performing a first heat treatment in an inert gas to form a first crystalline semiconductor film,
    forming a barrier layer over the first crystalline semiconductor film, forming a second semiconductor film containing a rare gas element over the barrier layer, performing a second heat treatment in an inert gas to move the catalyst element remaining in the first crystalline semiconductor film to the second semiconductor film, removing the second semiconductor film, and removing the barrier layer.

2. A process according to claim 1, wherein the second semiconductor film over the barrier layer contains the rare gas element at a concentration of $1\times10^{19}$ to $2\times10^{22}/cm^3$.

3. A process according to claim 1, wherein the semiconductor film contains oxygen at a concentration of $5\times10^{17}$ to $1\times10^{21}/cm^3$.

4. A process according to claim 1, wherein to the second semiconductor film is added at least one selected from the rare gas element and carbon at a concentration of $1\times10^{19}$ to $2\times10^{22}/cm^3$.

5. A process according to claim 1, wherein the semiconductor film has a film thickness of 5 nm or more.

6. A process according to claim 1, wherein the inert gas is one or more selected from nitrogen ($N_2$), argon (Ar), helium (He), neon (Ne), krypton (Kr), and xenon (Xe).

7. A process according to claim 1, wherein the barrier layer is a chemical oxide made from ozone water.

8. A process according to claim 1, wherein the barrier layer is formed by oxidization of the surface of the first amorphous semiconductor film by plasma treatment.

9. A process according to claim 1, wherein the barrier layer is formed by oxidizing the surface of the first amorphous semiconductor film with ozone generated by irradiation of the inside of an atmosphere containing oxygen with ultraviolet rays.

10. A process according to claim 1, wherein the barrier layer is a porous film formed to have a film thickness of 1 to 10 nm.

11. A process according to claim 1, wherein the barrier layer is a film formed by plasma CVD.

12. A process according to claim 1, wherein the rare gas element is one or more selected from helium (He), neon (Ne), argon (Ar), krypton (Kr), and xenon (Xe).

13. A process according to claim 1, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

14. A process according to claim 1 wherein said semiconductor device is incorporated into at least one selected from the group consisting of a personal computer, a video camera, a mobile computer, a goggle type display, a player using a record medium, and a digital camera.

15. A process for manufacturing a semiconductor device, comprising the steps of:

forming a first amorphous semiconductor film over an insulating surface, providing the first amorphous semiconductor film with a catalyst element for promoting crystallization, blowing a first heated inert gas to the first amorphous semiconductor film for 30 seconds to 5 minutes as a first heat treatment to form a first crystalline semiconductor film after providing the catalyst element, forming a barrier layer over the first crystalline semiconductor film, forming a second semiconductor film containing a rare gas element over the barrier layer, blowing a second heated inert gas as a second heat treatment to move the catalyst element remaining in the first crystalline semiconductor film to the second semiconductor film, removing the second semiconductor film, and removing the barrier layer.

16. A process according to claim 15, wherein the second semiconductor film over the barrier layer contains the rare gas element at a concentration of $1\times10^{19}$ to $2\times10^{22}/cm^3$.

17. A process according to claim 15, wherein the semiconductor film contains oxygen at a concentration of $5\times10^{17}$ to $1\times10^{21}/cm^3$.

18. A process according to claim 15, wherein to the second semiconductor film is added at least one selected from the rare gas element and carbon at a concentration of $1\times10^{19}$ to $2\times10^{22}/cm^3$.

19. A process according to claim 15, wherein in the first heat treatment the inert gas is heated at 600 to 800° C.

20. A process according to claim 15, wherein in the second heat treatment the inert gas is heated at 500 to 700° C.

21. A process according to claim 15, wherein the semiconductor film has a film thickness of 5 nm or more.

22. A process according to claim 15, wherein the inert gas is one or more selected from nitrogen ($N_2$), argon (Ar), helium (He), neon (Ne), krypton (Kr), and xenon (Xe).

23. A process according to claim 15, wherein the barrier layer is a chemical oxide made from ozone water.

24. A process according to claim 15, wherein the barrier layer is formed by oxidization of the surface of the first amorphous semiconductor film by plasma treatment.

25. A process according to claim 15, wherein the barrier layer is formed by oxidizing the surface of the first amorphous semiconductor film with ozone generated by irradiation of the inside of an atmosphere containing oxygen with ultraviolet rays.

26. A process according to claim 15, wherein the barrier layer is a porous film formed to have a film thickness of 1 to 10 nm.

27. A process according to claim 15, wherein the barrier layer is a film formed by plasma CVD.

28. A process according to claim 15, wherein the rare gas element is one or more selected from helium (He), neon (Ne), argon (Ar), krypton (Kr), and xenon (Xe).

29. A process according to claim 15, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

30. A process according to claim 15 wherein said semiconductor device is incorporated into at least one selected from the group consisting of a personal computer, a video camera, a mobile computer, a goggle type display, a player using a record medium, and a digital camera.

31. A process for manufacturing a semiconductor device, comprising the steps of:

forming a first amorphous semiconductor film over an insulating surface, providing the first amorphous semiconductor film with a catalyst element for promoting crystallization, and performing a first heat treatment in an inert gas to form a first crystalline semiconductor film, irradiating the first crystalline semiconductor film with a laser ray, forming a barrier layer over the first crystalline semiconductor film, forming a second semiconductor film containing a rare gas element over the barrier layer, performing a second heat treatment in an inert gas to move the catalyst element remaining in the first crystalline semiconductor film to the second semiconductor film, removing the semiconductor film, and removing the barrier layer.

32. A process according to claim 31, wherein the second semiconductor film over the barrier layer contains the rare gas element at a concentration of $1 \times 10^{19}$ to $2 \times 10^{22}/cm^3$.

33. A process according to claim 31, wherein the semiconductor film contains oxygen at a concentration of $5 \times 10^{17}$ to $1 \times 10^{21}/cm^3$.

34. A process according to claim 31, wherein to the second semiconductor film is added at least one selected from the rare gas element and carbon at a concentration of $1 \times 10^{19}$ to $2 \times 10^{22}/cm^3$.

35. A process according to claim 31, wherein the semiconductor film has a film thickness of 5 nm or more.

36. A process according to claim 31, wherein the inert gas is one or more selected from nitrogen ($N_2$), argon (Ar), helium (He), neon (Ne), krypton (Kr), and xenon (Xe).

37. A process according to claim 31, wherein the barrier layer is a chemical oxide made from ozone water.

38. A process according to claim 31, wherein the barrier layer is formed by oxidization of the surface of the first amorphous semiconductor film by plasma treatment.

39. A process according to claim 31, wherein the barrier layer is formed by oxidizing the surface of the first amorphous semiconductor film with ozone generated by irradiation of the inside of an atmosphere containing oxygen with ultraviolet rays.

40. A process according to claim 31, wherein the barrier layer is a porous film formed to have a film thickness of 1 to 10 nm.

41. A process according to claim 31, wherein the barrier layer is a film formed by plasma CVD.

42. A process according to claim 31, wherein the rare gas element is one or more selected from helium (He), neon (Ne), argon (Ar), krypton (Kr), and xenon (Xe).

43. A process according to claim 31, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

44. A process according to claim 31 wherein said semiconductor device is incorporated into at least one selected from the group consisting of a personal computer, a video camera, a mobile computer, a goggle type display, a player using a record medium, and a digital camera.

45. A process for manufacturing a semiconductor device, comprising the steps of:

forming a first amorphous semiconductor film containing oxygen and carbon at a concentration of $5 \times 10^{18}/cm^3$ or less over an insulating surface, providing the first amorphous semiconductor film with a catalyst element for promoting crystallization, and performing a first heat treatment in a heated inert gas to form a first crystalline semiconductor film, forming a barrier layer over the first crystalline semiconductor film, forming a second semiconductor film containing a rare gas element over the barrier layer, performing a second heat treatment in a heated inert gas to move the catalyst element remaining in the first crystalline semiconductor film to the second semiconductor film, removing the second semiconductor film, and removing the barrier layer.

46. A process according to claim 45, wherein the second semiconductor film over the barrier layer contains the rare gas element at a concentration of $1 \times 10^{19}$ to $2 \times 10^{22}/cm^3$.

47. A process according to claim 45, wherein the semiconductor film contains oxygen at a concentration of $5 \times 10^{17}$ to $1 \times 10^{21}/cm^3$.

48. A process according to claim 45, wherein to the second semiconductor film is added at least one selected from the rare gas element and carbon at a concentration of $1 \times 10^{19}$ to $2 \times 10^{22}/cm^3$.

49. A process according to claim 45, wherein the semiconductor film has a film thickness of 5 nm or more.

50. A process according to claim 45, wherein the inert gas is one or more selected from nitrogen ($N_2$), argon (Ar), helium (He), neon (Ne), krypton (Kr), and xenon (Xe).

51. A process according to claim 45, wherein the barrier layer is a chemical oxide made from ozone water.

52. A process according to claim 45, wherein the barrier layer is formed by oxidization of the surface of the first amorphous semiconductor film by plasma treatment.

53. A process according to claim 45, wherein the barrier layer is formed by oxidizing the surface of the first amorphous semiconductor film with ozone generated by irradiation of the inside of an atmosphere containing oxygen with ultraviolet rays.

54. A process according to claim 45, wherein the barrier layer is a porous film formed to have a film thickness of 1 to 10 nm.

55. A process according to claim 45, wherein the barrier layer is a film formed by plasma CVD.

56. A process according to claim 45, wherein the rare gas element is one or more selected from helium (He), neon (Ne), argon (Ar), krypton (Kr), and xenon (Xe).

57. A process according to claim 45, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

58. A process according to claim 45 wherein said semiconductor device is incorporated into at least one selected from the group consisting of a personal computer, a video camera, a mobile computer, a goggle type display, a player using a record medium, and a digital camera.

59. A process according to claim 45, wherein in the first heat treatment the inert gas is heated at 600 to 800° C.

60. A process according to claim 45, wherein in the second heat treatment the inert gas is heated at 500 to 700° C.

61. A process for manufacturing a semiconductor device, comprising the steps of:

forming a first amorphous semiconductor film containing oxygen and carbon at a concentration of $5 \times 10^{18}/cm^3$ or less over an insulating surface, providing the first semiconductor film with a catalyst element for promoting crystallization, and performing a first heat treatment in an inert gas to form a first crystalline semiconductor film, irradiating the first crystalline semiconductor film with a laser ray, forming a barrier layer over the first crystalline semiconductor film, forming a second semiconductor film containing a rare gas element over the barrier layer, performing a second heat treatment in an inert gas to move the catalyst remaining in the first crystalline semiconductor film to the second semiconductor film, removing the second semiconductor film, and removing the barrier layer.

62. A process according to claim 61, wherein the second semiconductor film over the barrier layer contains the rare gas element at a concentration of $1 \times 10^{19}$ to $2 \times 10^{22}/cm^3$.

63. A process according to claim 61, wherein the semiconductor film contains oxygen at a concentration of $5 \times 10^{17}$ to $1 \times 10^{21}/cm^3$.

64. A process according to claim 61, wherein to the second semiconductor film is added at least one selected from the rare gas element and carbon at a concentration of $1 \times 10^{19}$ to $2 \times 10^{22}/cm^3$.

65. A process according to claim 61, wherein the semiconductor film has a film thickness of 5 nm or more.

66. A process according to claim 61, wherein the inert gas is one or more selected from nitrogen ($N_2$), argon (Ar), helium (He), neon (Ne), krypton (Kr), and xenon (Xe).

67. A process according to claim 61, wherein the barrier layer is a chemical oxide made from ozone water.

68. A process according to claim 61, wherein the barrier layer is formed by oxidization of the surface of the first amorphous semiconductor film by plasma treatment.

69. A process according to claim 61, wherein the barrier layer is formed by oxidizing the surface of the first amorphous semiconductor film with ozone generated by irradiation of the inside of an atmosphere containing oxygen with ultraviolet rays.

70. A process according to claim 61, wherein the barrier layer is a porous film formed to have a film thickness of 1 to 10 nm.

71. A process according to claim 61, wherein the barrier layer is a film formed by plasma CVD.

72. A process according to claim 61, wherein the rare gas element is one or more selected from helium (He), neon (Ne), argon (Ar), krypton (Kr), and xenon (Xe).

73. A process according to claim 61, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

74. A process according to claim 61 wherein said semiconductor device is incorporated into at least one selected from the group consisting of a personal computer, a video camera, a mobile computer, a goggle type display, a player using a record medium, and a digital camera.

75. A process for manufacturing a semiconductor device, comprising the steps of:

forming a first amorphous semiconductor film containing oxygen and carbon at a concentration of $5 \times 10^{18}/cm^3$ or less over an insulating surface, providing the first amorphous semiconductor film with a catalyst element for promoting crystallization, and performing a first heat treatment in a heated inert gas to form a first crystalline semiconductor film, irradiating the first crystalline semiconductor film with a laser ray, forming a barrier layer over the first crystalline semiconductor film, forming a second semiconductor film containing a rare gas element over the barrier layer, performing a second heat treatment in a heated inert gas to move the catalyst element remaining in the first crystalline semiconductor film to the second semiconductor film, removing the second semiconductor film, and removing the barrier layer.

76. A process according to claim 75, wherein the second semiconductor film over the barrier layer contains the rare gas element at a concentration of $1 \times 10^{19}$ to $2 \times 10^{22}/cm^3$.

77. A process according to claim 75, wherein the semiconductor film contains oxygen at a concentration of $5 \times 10^{17}$ to $1 \times 10^{21}/cm^3$.

78. A process according to claim 75, wherein to the second semiconductor film is added at least one selected from the rare gas element and carbon at a concentration of $1 \times 10^{19}$ to $2 \times 10^{22}/cm^3$.

79. A process according to claim 75, wherein the semiconductor film has a film thickness of 5 nm or more.

80. A process according to claim 75, wherein the inert gas is one or more selected from nitrogen ($N_2$), argon (Ar), helium (He), neon (Ne), krypton (Kr), and xenon (Xe).

81. A process according to claim 75, wherein the barrier layer is a chemical oxide made from ozone water.

82. A process according to claim 75, wherein the barrier layer is formed by oxidization of the surface of the first amorphous semiconductor film by plasma treatment.

83. A process according to claim 75, wherein the barrier layer is formed by oxidizing the surface of the first amorphous semiconductor film with ozone generated by irradiation of the inside of an atmosphere containing oxygen with ultraviolet rays.

84. A process according to claim 75, wherein the barrier layer is a porous film formed to have a film thickness of 1 to 10 nm.

85. A process according to claim 75, wherein the barrier layer is a film formed by plasma CVD.

86. A process according to claim 75, wherein the rare gas element is one or more selected from helium (He), neon (Ne), argon (Ar), krypton (Kr), and xenon (Xe).

87. A process according to claim 75, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

88. A process according to claim 75 wherein said semiconductor device is incorporated into at least one selected from the group consisting of a personal computer, a video camera, a mobile computer, a goggle type display, a player using a record medium, and a digital camera.

89. A process according to claim 75, wherein in the first heat treatment the inert gas is heated at 600 to 800° C.

90. A process according to claim 75, wherein in the second heat treatment the inert gas is heated at 500 to 700° C.

91. A process for manufacturing a semiconductor device, comprising the steps of:

forming a first amorphous semiconductor film over an insulating surface, providing the first amorphous semiconductor film with a catalyst element for promoting crystallization, blowing a first heated inert gas to the first amorphous semiconductor film to form a first crystalline semiconductor film after providing the catalyst element, forming a barrier layer over the first crystalline semiconductor film, forming a second semiconductor film containing a rare gas element over the barrier layer, blowing a second heated inert gas to move the catalyst element remaining in the first crystalline semiconductor film to the second semiconductor film, removing the second semiconductor film, and removing the barrier layer.

92. A process according to claim 91, wherein the second semiconductor film over the barrier layer contains the rare gas element at a concentration of $1 \times 10^{19}$ to $2 \times 10^{22}/cm^3$.

93. A process according to claim 91, wherein the semiconductor film contains oxygen at a concentration of $5 \times 10^{17}$ to $1 \times 10^{21}/cm^3$.

94. A process according to claim 91, wherein to the second semiconductor film is added at least one selected from the rare gas element and carbon at a concentration of $1 \times 10^{19}$ to $2 \times 10^{22}/cm^3$.

95. A process according to claim 91, wherein the first inert gas is heated at 600 to 800° C.

96. A process according to claim 91, wherein the second inert gas is heated at 500 to 700° C.

97. A process according to claim 91, wherein the semiconductor film has a film thickness of 5 nm or more.

98. A process according to claim 91, wherein the inert gas is one or more selected from nitrogen ($N_2$), argon (Ar), helium (He), neon (Ne), krypton (Kr), and xenon (Xe).

99. A process according to claim 91, wherein the rare gas element is one or more selected from helium (He), neon (Ne), argon (Ar), krypton (Kr), and xenon (Xe).

100. A process according to claim 91, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

101. A process according to claim 91 wherein said semiconductor device is incorporated into at least one selected from the group consisting of a personal computer, a video camera, a mobile computer, a goggle type display, a player using a record medium, and a digital camera.

102. A process for manufacturing a semiconductor device, comprising the steps of:

forming a first amorphous semiconductor film over an insulating surface, providing the first amorphous semiconductor film with a catalyst element for promoting crystallization in a heat treatment chamber, flowing a first heated inert gas into the heat treatment chamber to form a first crystalline semiconductor film after providing the catalyst element, forming a barrier layer over the first crystalline semiconductor film, forming a second semiconductor film containing a rare gas element over the barrier layer, flowing a second heated inert gas into the heat treatment chamber to move the catalyst element remaining in the first crystalline semiconductor film to the second semiconductor film, removing the second semiconductor film, and removing the barrier layer.

103. A process according to claim 102, wherein the second semiconductor film over the barrier layer contains the rare gas element at a concentration of $1 \times 10^{19}$ to $2 \times 10^{22}/cm^3$.

104. A process according to claim 102, wherein the semiconductor film contains oxygen at a concentration of $5 \times 10^{17}$ to $1 \times 10^{21}/cm^3$.

105. A process according to claim 102, wherein to the second semiconductor film is added at least one selected from the rare gas element and carbon at a concentration of $1 \times 10^{19}$ to $2 \times 10^{22}/cm^3$.

106. A process according to claim 102, wherein the first inert gas is heated at 600 to 800° C.

107. A process according to claim 102, wherein the second inert gas is heated at 500 to 700° C.

108. A process according to claim 102, wherein the semiconductor film has a film thickness of 5 nm or more.

109. A process according to claim 102, wherein the inert gas is one or more selected from nitrogen ($N_2$), argon (Ar), helium (He), neon (Ne), krypton (Kr), and xenon (Xe).

110. A process according to claim 102, wherein the rare gas element is one or more selected from helium (He), neon (Ne), argon (Ar), krypton (Kr), and xenon (Xe).

111. A process according to claim 102, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

112. A process according to claim 102, wherein said semiconductor device is incorporated into at least one selected from the group consisting of a personal computer, a video camera, a mobile computer, a goggle type display, a player using a record medium, and a digital camera.

113. A process for manufacturing a semiconductor device, comprising the steps of:

forming a first amorphous semiconductor film over an insulating surface, providing the first amorphous semiconductor film with a catalyst element for promoting crystallization, blowing a first heated inert gas to the first amorphous semiconductor film as a first heat treatment to form a first crystalline semiconductor film after providing the catalyst element, wherein the first inert gas is heated in a gas heating chamber, forming a barrier layer over the first crystalline semiconductor film, forming a second semiconductor film containing a rare gas element over the barrier layer, blowing a second heated inert gas as a second heat treatment to move the catalyst element remaining in the first crystalline semiconductor film to the second semiconductor film, wherein the second inert gas is heated in the gas heating chamber, removing the second semiconductor film, and removing the barrier layer.

114. A process according to claim 113, wherein the second semiconductor film over the barrier layer contains the rare gas element at a concentration of $1 \times 10^{19}$ to $2 \times 10^{22}/cm^3$.

115. A process according to claim 113, wherein the semiconductor film contains oxygen at a concentration of $5 \times 10^{17}$ to $1 \times 10^{21}/cm^3$.

116. A process according to claim 113, wherein to the second semiconductor film is added at least one selected from the rare gas element and carbon at a concentration of $1 \times 10^{19}$ to $2 \times 10^{22}/cm^3$.

117. A process according to claim 113, wherein in the first heat treatment the inert gas is heated at 600 to 800° C.

118. A process according to claim 113, wherein in the second heat treatment the inert gas is heated at 500 to 700° C.

119. A process according to claim 113, wherein the semiconductor film has a film thickness of 5 nm or more.

120. A process according to claim 113, wherein the inert gas is one or more selected from nitrogen ($N_2$), argon (Ar), helium (He), neon (Ne), krypton (Kr), and xenon (Xe).

121. A process according to claim 113, wherein the rare gas element is one or more selected from helium (He), neon (Ne), argon (Ar), krypton (Kr), and xenon (Xe).

122. A process according to claim 113, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

123. A process according to claim 113, wherein said semiconductor device is incorporated into at least one selected from the group consisting of a personal computer, a video camera, a mobile computer, a goggle type display, a player using a record medium, and a digital camera.

124. A process for manufacturing a semiconductor device, comprising the steps of:
forming a first amorphous semiconductor film over an insulating surface,
providing the first amorphous semiconductor film with a catalyst element for promoting crystallization,
blowing a first heated inert gas to the first amorphous semiconductor film to form a first crystalline semiconductor film after providing the catalyst element, wherein the first inert gas is heated in a gas heating chamber,
forming a barrier layer over the first crystalline semiconductor film,
forming a second semiconductor film containing a rare gas element over the barrier layer,
blowing a second heated inert gas to move the catalyst element remaining in the first crystalline semiconductor film to the second semiconductor film, wherein the second inert gas is heated in the gas heating chamber,
removing the second semiconductor film, and
removing the barrier layer.

125. A process according to claim 124, wherein the second semiconductor film over the barrier layer contains the rare gas element at a concentration of $1 \times 10^{19}$ to $2 \times 10^{22}/cm^3$.

126. A process according to claim 124, wherein the semiconductor film contains oxygen at a concentration of $5 \times 10^{17}$ to $1 \times 10^{21}/cm^3$.

127. A process according to claim 124, wherein to the second semiconductor film is added at least one selected from the rare gas element and carbon at a concentration of $1 \times 10^{19}$ to $2 \times 10^{22}/cm^3$.

128. A process according to claim 124, wherein the first inert gas is heated at 600 to 800° C.

129. A process according to claim 124, wherein the second inert gas is heated at 500 to 700° C.

130. A process according to claim 124, wherein the semiconductor film has a film thickness of 5 nm or more.

131. A process according to claim 124, wherein the inert gas is one or more selected from nitrogen ($N_2$), argon (Ar), helium (He), neon (Ne), krypton (Kr), and xenon (Xe).

132. A process according to claim 124, wherein the rare gas element is one or more selected from helium (He), neon (Ne), argon (Ar), krypton (Kr), and xenon (Xe).

133. A process according to claim 124, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

134. A process according to claim 124, wherein said semiconductor device is incorporated into at least one selected from the group consisting of a personal computer, a video camera, a mobile computer, a goggle type display, a player using a record medium, and a digital camera.

135. A process for manufacturing a semiconductor device, comprising the steps of:
forming a first amorphous semiconductor film over an insulating surface,
providing the first amorphous semiconductor film with a catalyst element for promoting crystallization in a heat treatment chamber,
flowing a first heated inert gas into the heat treatment chamber to form a first crystalline semiconductor film after providing the catalyst element, wherein the first inert gas is heated in a gas heating chamber,
forming a barrier layer over the first crystalline semiconductor film,
forming a second semiconductor film containing a rare gas element over the barrier layer,
flowing a second heated inert gas into the heat treatment chamber to move the catalyst element remaining in the first crystalline semiconductor film to the second semiconductor film, wherein the second inert gas is heated in the gas heating chamber,
removing the second semiconductor film, and
removing the barrier layer.

136. A process according to claim 135, wherein the second semiconductor film over the barrier layer contains the rare gas element at a concentration of $1 \times 10^{19}$ to $2 \times 10^{22}/cm^3$.

137. A process according to claim 135, wherein the semiconductor film contains oxygen at a concentration of $5 \times 10^{17}$ to $1 \times 10^{21}/cm^3$.

138. A process according to claim 135, wherein to the second semiconductor film is added at least one selected from the rare gas element and carbon at a concentration of $1 \times 10^{19}$ to $2 \times 10^{22}/cm^3$.

139. A process according to claim 135, wherein the first inert gas is heated at 600 to 800° C.

140. A process according to claim 135, wherein the second inert gas is heated at 500 to 700° C.

141. A process according to claim 135, wherein the semiconductor film has a film thickness of 5 nm or more.

142. A process according to claim 135, wherein the inert gas is one or more selected from nitrogen ($N_2$), argon (Ar), helium (He), neon (Ne), krypton (Kr), and xenon (Xe).

143. A process according to claim 135, wherein the rare gas element is one or more selected from helium (He), neon (Ne), argon (Ar), krypton (Kr), and xenon (Xe).

144. A process according to claim 135, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

145. A process according to claim 135 wherein said semiconductor device is incorporated into at least one selected from the group consisting of a personal computer, a video camera, a mobile computer, a goggle type display, a player using a record medium, and a digital camera.

146. A process for manufacturing a semiconductor device, comprising the steps of:
forming a first amorphous semiconductor film over an insulating surface,
providing the first amorphous semiconductor film with a catalyst element for promoting crystallization, blowing a first heated inert gas to the first amorphous semiconductor film as a first heat treatment to form a first crystalline semiconductor film after providing the catalyst element, forming a barrier layer over the first crystalline semiconductor film, forming a second semiconductor film containing a rare gas element over the barrier layer, blowing a second heated inert gas for 1 to 10 minutes as a second heat treatment to move the catalyst element remaining in the first crystalline semiconductor film to the second semiconductor film, removing the second semiconductor film, and removing the barrier layer.

147. A process according to claim 146, wherein the second semiconductor film over the barrier layer contains the rare gas element at a concentration of $1 \times 10^{19}$ to $2 \times 10^{22}$/cm$^3$.

148. A process according to claim 146, wherein the semiconductor film contains oxygen at a concentration of $5 \times 10^{17}$ to $1 \times 10^{21}$/cm$^3$.

149. A process according to claim 146, wherein to the second semiconductor film is added at least one selected from the rare gas element and carbon at a concentration of $1 \times 10^{19}$ to $2 \times 10^{22}$/cm$^3$.

150. A process according to claim 146, wherein in the first heat treatment the inert gas is heated at 600 to 800° C.

151. A process according to claim 146, wherein in the second heat treatment the inert gas is heated at 500 to 700° C.

152. A process according to claim 146, wherein the semiconductor film has a film thickness of 5 nm or more.

153. A process according to claim 146, wherein the inert gas is one or more selected from nitrogen (N$_2$), argon (Ar), helium (He), neon (Ne), krypton (Kr), and xenon (Xe).

154. A process according to claim 146, wherein the barrier layer is a chemical oxide made from ozone water.

155. A process according to claim 146, wherein the barrier layer is formed by oxidization of the surface of the first amorphous semiconductor film by plasma treatment.

156. A process according to claim 146, wherein the barrier layer is formed by oxidizing the surface of the first amorphous semiconductor film with ozone generated by irradiation of the inside of an atmosphere containing oxygen with ultraviolet rays.

157. A process according to claim 146, wherein the barrier layer is a porous film formed to have a film thickness of 1 to 10 nm.

158. A process according to claim 146, wherein the barrier layer is a film formed by plasma CVD.

159. A process according to claim 146, wherein the rare gas element is one or more selected from helium (He), neon (Ne), argon (Ar), krypton (Kr), and xenon (Xe).

160. A process according to claim 146, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

161. A process according to claim 146, wherein said semiconductor device is incorporated into at least one selected from the group consisting of a personal computer, a video camera, a mobile computer, a goggle type display, a player using a record medium, and a digital camera.

162. A process for manufacturing a semiconductor device, comprising the steps of:

forming a first amorphous semiconductor film over an insulating surface, providing the first amorphous semiconductor film with a catalyst element for promoting crystallization, blowing a first heated inert gas to the first amorphous semiconductor film for 30 seconds to 5 minutes as a first heat treatment to form a first crystalline semiconductor film after providing the catalyst element, forming a barrier layer over the first crystalline semiconductor film, forming a second semiconductor film containing a rare gas element over the barrier layer, blowing a second heated inert gas for 1 to 10 minutes as a second heat treatment to move the catalyst element remaining in the first crystalline semiconductor film to the second semiconductor film, removing the second semiconductor film, and removing the barrier layer.

163. A process according to claim 162, wherein the second semiconductor film over the barrier layer contains the rare gas element at a concentration of $1 \times 10^{19}$ to $2 \times 10^{22}$/cm$^3$.

164. A process according to claim 162, wherein the semiconductor film contains oxygen at a concentration of $5 \times 10^{17}$ to $1 \times 10^{21}$/cm$^3$.

165. A process according to claim 162, wherein to the second semiconductor film is added at least one selected from the rare gas element and carbon at a concentration of $1 \times 10^{19}$ to $2 \times 10^{22}$/cm$^3$.

166. A process according to claim 162, wherein in the first heat treatment the inert gas is heated at 600 to 800° C.

167. A process according to claim 162, wherein in the second heat treatment the inert gas is heated at 500 to 700° C.

168. A process according to claim 162, wherein the semiconductor film has a film thickness of 5 nm or more.

169. A process according to claim 162, wherein the inert gas is one or more selected from nitrogen (N$_2$), argon (Ar), helium (He), neon (Ne), krypton (Kr), and xenon (Xe).

170. A process according to claim 162, wherein the barrier layer is a chemical oxide made from ozone water.

171. A process according to claim 162, wherein the barrier layer is formed by oxidization of the surface of the first amorphous semiconductor film by plasma treatment.

172. A process according to claim 162, wherein the barrier layer is formed by oxidizing the surface of the first amorphous semiconductor film with ozone generated by irradiation of the inside of an atmosphere containing oxygen with ultraviolet rays.

173. A process according to claim 162, wherein the barrier layer is a porous film formed to have a film thickness of 1 to 10 nm.

174. A process according to claim 162, wherein the barrier layer is a film formed by plasma CVD.

175. A process according to claim 162, wherein the rare gas element is one or more selected from helium (He), neon (Ne), argon (Ar), krypton (Kr), and xenon (Xe).

176. A process according to claim 162, wherein the catalyst element is one or more selected from iron (Fe), nickel (Ni), cobalt (Co), ruthenium (Ru), rhodium (Rh), palladium (Pd), osmium (Os), iridium (Ir), platinum (Pt), copper (Cu), gold (Au) and aluminum (Al).

177. A process according to claim 162, wherein said semiconductor device is incorporated into at least one selected from the group consisting of a personal computer, a video camera, a mobile computer, a goggle type display, a player using a record medium, and a digital camera.

* * * * *